(12) United States Patent
Yu et al.

(10) Patent No.: US 11,521,983 B2
(45) Date of Patent: Dec. 6, 2022

(54) METHOD OF FABRICATING THREE-DIMENSIONAL SEMICONDUCTOR MEMORY DEVICE

(71) Applicant: SAMSUNG ELECTRONICS CO., LTD., Suwon-si (KR)

(72) Inventors: Han Geun Yu, Seoul (KR); Daehyun Jang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 131 days.

(21) Appl. No.: 16/863,381

(22) Filed: Apr. 30, 2020

(65) Prior Publication Data

US 2020/0266209 A1  Aug. 20, 2020

Related U.S. Application Data

(63) Continuation of application No. 16/180,609, filed on Nov. 5, 2018, now Pat. No. 10,672,790.

(30) Foreign Application Priority Data

Mar. 14, 2018  (KR) .......................... 10-2018-0029847

(51) Int. Cl.
*H01L 27/11582* (2017.01)
*H01L 27/11565* (2017.01)
(Continued)

(52) U.S. Cl.
CPC .... *H01L 27/11582* (2013.01); *H01L 21/0332* (2013.01); *H01L 21/0337* (2013.01);
(Continued)

(58) Field of Classification Search
CPC ..................... H01L 27/10894; H01L 27/11578
See application file for complete search history.

(56) References Cited

U.S. PATENT DOCUMENTS 8,883,576 B2  11/2014 Lee et al.
9,412,617 B2  8/2016 Narishige et al.
(Continued)

FOREIGN PATENT DOCUMENTS

KR  10-2011-0015338 A  2/2011
KR  10-2013-0047405 A  5/2013
(Continued)

*Primary Examiner* — Moazzam Hossain
(74) *Attorney, Agent, or Firm* — Sughrue Mion, PLLC

(57) ABSTRACT

Methods of fabricating a three-dimensional semiconductor memory device are provided. A method may include forming a mold structure on a substrate including channel regions and a non-channel region between the channel regions, and forming, on the mold structure, a multilayered mask layer including a first mask layer, an etch stop layer, and a second mask layer that are sequentially stacked. The multilayered mask layer may include mask holes exposing the mold structure in the channel regions, dummy mask holes exposing the first mask layer in the non-channel region, and buffer spacers covering sidewalls of the second mask layer exposed by the mask holes and the dummy mask holes. The method may include etching the mold structure using the multilayered mask layer as an etch mask to form channel holes in the channel regions.

12 Claims, 28 Drawing Sheets

(51) Int. Cl.
  *H01L 27/11568*  (2017.01)
  *H01L 21/033*  (2006.01)
  *H01L 21/311*  (2006.01)
  *H01L 29/10*  (2006.01)
  *H01L 21/02*  (2006.01)

(52) U.S. Cl.
  CPC .. *H01L 21/31144* (2013.01); *H01L 27/11565* (2013.01); *H01L 27/11568* (2013.01); *H01L 21/0228* (2013.01); *H01L 21/02115* (2013.01); *H01L 21/02164* (2013.01); *H01L 21/02282* (2013.01); *H01L 21/02636* (2013.01); *H01L 29/1037* (2013.01)

(56) References Cited

U.S. PATENT DOCUMENTS

| | | | |
|---|---|---|---|
| 9,412,752 | B1 | 8/2016 | Yeh et al. |
| 9,525,065 | B1 | 12/2016 | Kyeon et al. |
| 9,679,815 | B2 | 6/2017 | Lee et al. |
| 2010/0172178 | A1 | 7/2010 | Okajima |
| 2015/0104946 | A1 | 4/2015 | Park et al. |
| 2015/0194441 | A1 | 7/2015 | Yatsuda et al. |
| 2015/0294978 | A1 | 10/2015 | Lu et al. |
| 2016/0071741 | A1 | 3/2016 | Imamura et al. |
| 2016/0104718 | A1 | 4/2016 | Omura et al. |
| 2016/0314970 | A1 | 10/2016 | Park et al. |
| 2018/0277564 | A1* | 9/2018 | Sugiura ............... H01L 21/0217 |
| 2018/0342519 | A1 | 11/2018 | Kim et al. |
| 2019/0139985 | A1 | 5/2019 | Kim et al. |

FOREIGN PATENT DOCUMENTS

| | | |
|---|---|---|
| KR | 10-2016-0123032 A | 10/2016 |
| KR | 10-2017-0030283 A | 3/2017 |

* cited by examiner

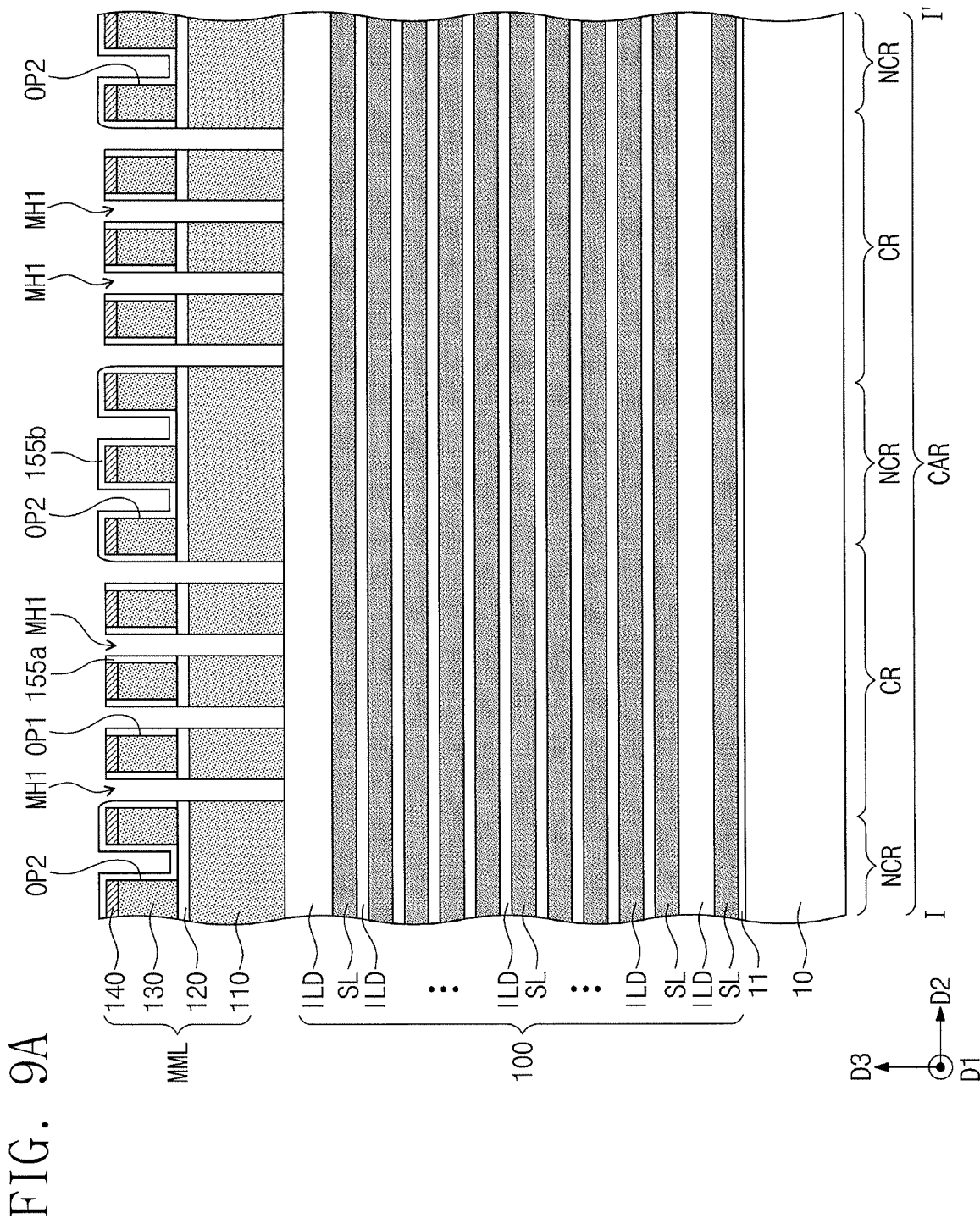

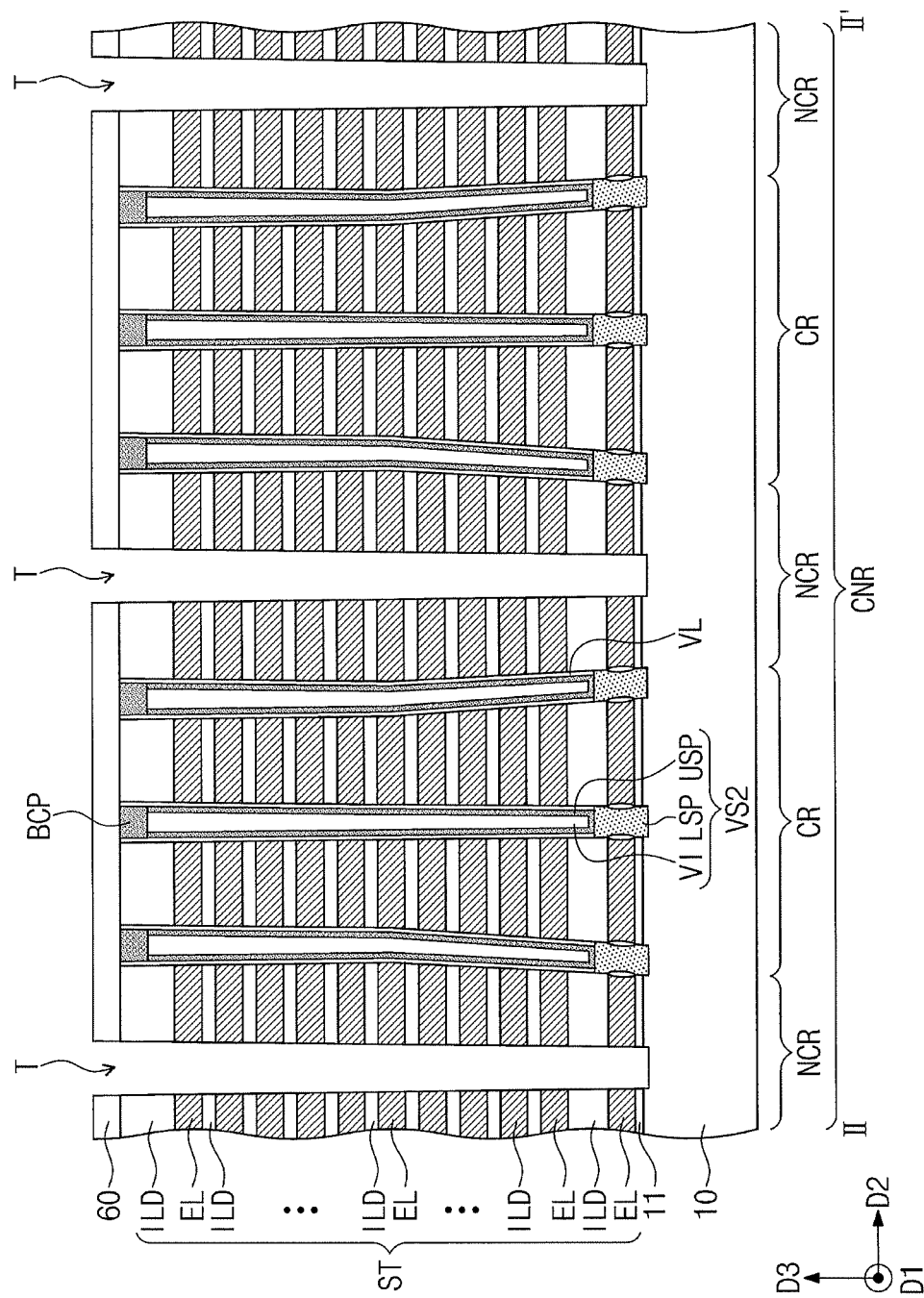

METHOD OF FABRICATING THREE-DIMENSIONAL SEMICONDUCTOR MEMORY DEVICE

CROSS-REFERENCE TO RELATED APPLICATION

This is a continuation of U.S. application Ser. No. 16/180,609 filed Nov. 5, 2018, which claims priority under 35 U.S.C. § 119 to Korean Patent Application No. 10-2018-0029847 filed on Mar. 14, 2018 in the Korean Intellectual Property Office, the entire contents of which are hereby incorporated herein by reference in their entirety.

FIELD

Embodiments of the inventive concepts relate to methods of fabricating semiconductor devices, and, more specifically, to methods of fabricating three-dimensional semiconductor memory devices.

BACKGROUND

A semiconductor device may be highly integrated to meet demands of high performance and low costs. For example, an integration degree of a two-dimensional (2D) or planar semiconductor device may be primarily determined by an area used for a unit memory cell. Therefore, the integration density of the 2D or planar semiconductor device may depend on a technique used for a fine pattern formation. However, equipment used for such a fine pattern formation in a 2D or planar semiconductor manufacturing process may have a high cost and, therefore, a cost of manufacture may limit an increase of the integration density of the 2D or planar semiconductor device.

A three-dimensional semiconductor memory device including three-dimensional memory cells may reduce or overcome the above limitations.

SUMMARY

According to some embodiments of the inventive concepts, a method of fabricating a three-dimensional semiconductor memory device may include forming a mold structure on a surface of a substrate. The mold structure may include a plurality of channel regions and a non-channel region between the channel regions. The method may include forming, on the mold structure, a multilayered mask layer including a first mask layer, an etch stop layer, and a second mask layer that are sequentially stacked. The multilayered mask layer may further include mask holes that expose the mold structure in the channel regions, dummy mask holes that expose the first mask layer in the non-channel region, and buffer spacers covering sidewalls of the second mask layer exposed by the mask holes and the dummy mask holes. The method may include etching the mold structure using the multilayered mask layer as an etch mask to form channel holes in the channel regions.

According to some embodiments of the inventive concepts, a method of fabricating a three-dimensional semiconductor memory device may include forming a mold structure on a surface of a substrate. The mold structure may include a plurality of channel regions and a non-channel region between the channel regions. The method may include sequentially forming a first mask layer, an etch stop layer, and a second mask layer on the mold structure, forming first openings in the second mask layer in the channel regions and second openings in the second mask layer in the non-channel region, and forming a first buffer layer on the second mask layer. The first buffer layer may conformally cover inner surfaces of the first openings and inner surfaces of the second openings. The method may include forming a sacrificial mask layer that fills the second openings having the first buffer layer. The sacrificial mask layer may include block openings that expose the first openings. The method may include anisotropically etching the etch stop layer and the first mask layer using the sacrificial mask layer as an etch mask to form a multilayered mask layer. The multilayered mask layer may include mask holes that expose the mold structure in the channel regions. The method may include etching the mold structure using the multilayered mask layer as an etch mask to form channel holes in the channel regions.

According to some embodiments of the inventive concepts, a method of fabricating a three-dimensional semiconductor memory device may include forming a mold structure on a substrate. The mold structure may include a cell array region and a connection region that are adjacent to each other in a first direction. The cell array region and the connection region may each include a plurality of channel regions and a plurality of non-channel regions that are alternately arranged in a second direction perpendicular to the first direction. The method may include forming a multilayered mask layer including a first mask layer, an etch stop layer, and a second mask layer that are sequentially stacked on the mold structure. The multilayered mask layer may further include first mask holes that expose the mold structure in the channel regions of the cell array region, second mask holes that expose the mold structure in the channel regions of the connection region, and dummy mask holes that expose the first mask layer in the non-channel regions of the cell array region, and etching the mold structure using the multilayered mask layer as an etch mask to form first channel holes penetrating the mold structure in the channel regions of the cell array region and second channel holes penetrating the mold structure in the channel regions of the connection region.

BRIEF DESCRIPTION OF THE DRAWINGS

FIGS. 3A, 4A, 5A, 6A, 7A, 8A, 9A, 10A, 11A, and 12A are cross-sectional views taken along line I-I' of FIG. 2, illustrating operations of methods of forming channel holes of a three-dimensional semiconductor memory device according to some embodiments.

FIGS. 3B, 4B, 5B, 6B, 7B, 8B, 9B, 10B, 11B, and 12B are cross-sectional views taken along line II-II' of FIG. 2, illustrating operations of methods of forming channel holes of a three-dimensional semiconductor memory device according to some embodiments.

DETAILED DESCRIPTION OF THE EMBODIMENTS

Various example embodiments will be described more fully with reference to the accompanying drawings in which some embodiments are shown. However, the inventive concepts may be embodied in many alternate forms and should not be construed as limited only to the embodiments set forth herein.

Figure 1:
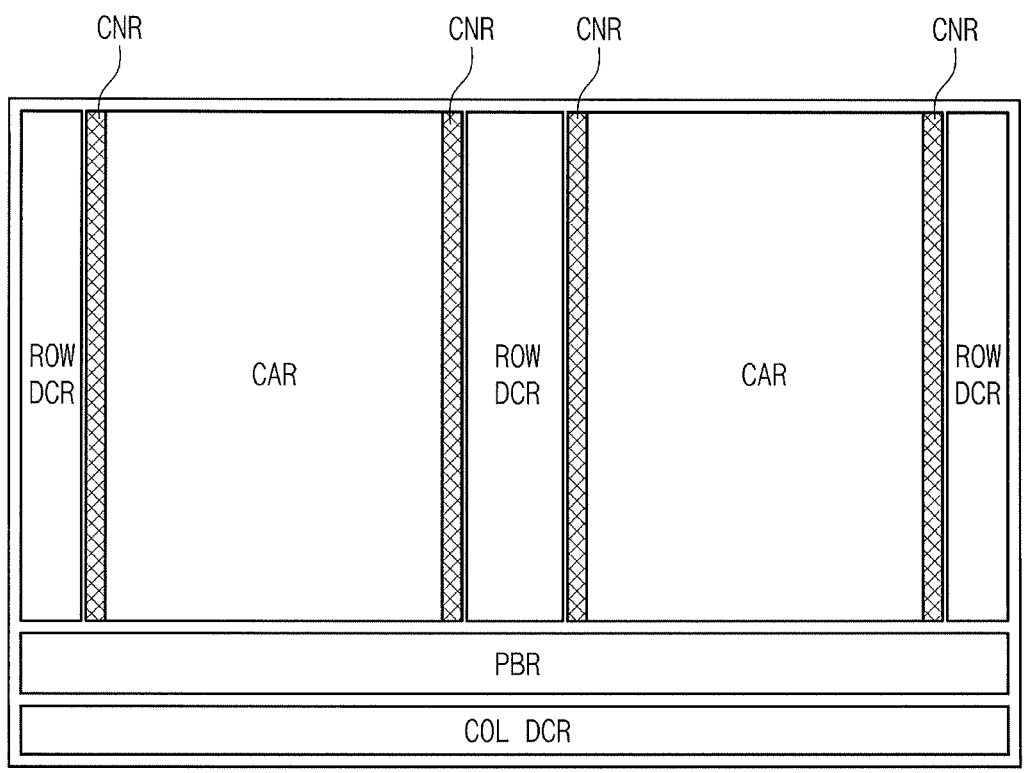
FIG. 1 is a schematic plan view illustrating a three-dimensional semiconductor memory device according to some embodiments.

FIG. 1 is a schematic plan view illustrating a three-dimensional semiconductor memory device according to some embodiments.

Referring to FIG. 1, a three-dimensional (3D) semiconductor memory device may include a cell array region CAR and a peripheral circuit region. The peripheral circuit region may include row decoder regions ROW DCR, a page buffer region PBR, a column decoder region COL DCR, and a control circuit region. In some embodiments, a connection region CNR may be between the call array region CAR and the row decoder regions ROW DCR.

A memory cell array including a plurality of memory cells may be in the cell array region CAR. In some embodiments, the memory cell array may include the memory cells arrayed in three dimensions, a plurality of word lines connected to the memory cells, and a plurality of bit lines connected to the memory cells. In some embodiments, the three-dimensional semiconductor memory device may be a vertical NAND flash memory device, and cell strings may be in the cell array region CAR arranged two-dimensionally in a first direction (see, e.g., D1 of FIG. 2) and a second direction (see, e.g., D3 of FIG. 2) and may extend in a third direction (see, e.g., D3 of FIG. 2) perpendicular to the first and second directions. Each of the cell strings may include at least one string selection transistor, a plurality of memory cell transistors, and at least one ground selection transistor that are connected in series. Each of the memory cell transistors may include a data storage element.

Interconnection structures (e.g., contact plugs and conductive lines) for electrically connecting the memory cell array and the row decoder may be in the connection region CNR.

The row decoder for selecting the word lines of the memory cell array may be in the row decoder region ROW DCR. The row decoder may select one of the word lines in accordance with an address information In the page buffer region PBR, a page buffer for reading data stored in the memory cells may be disposed. The page buffer may temporarily store data to be stored in the memory cells or may sense the data stored in the memory cells, according to an operation mode.

A column decoder may be in the column decoder region COL DCR connected to the bit lines of the memory cell array. The column decoder may provide a data transmission path between the page buffer and an external device (e.g., a memory controller).

Figure 2:
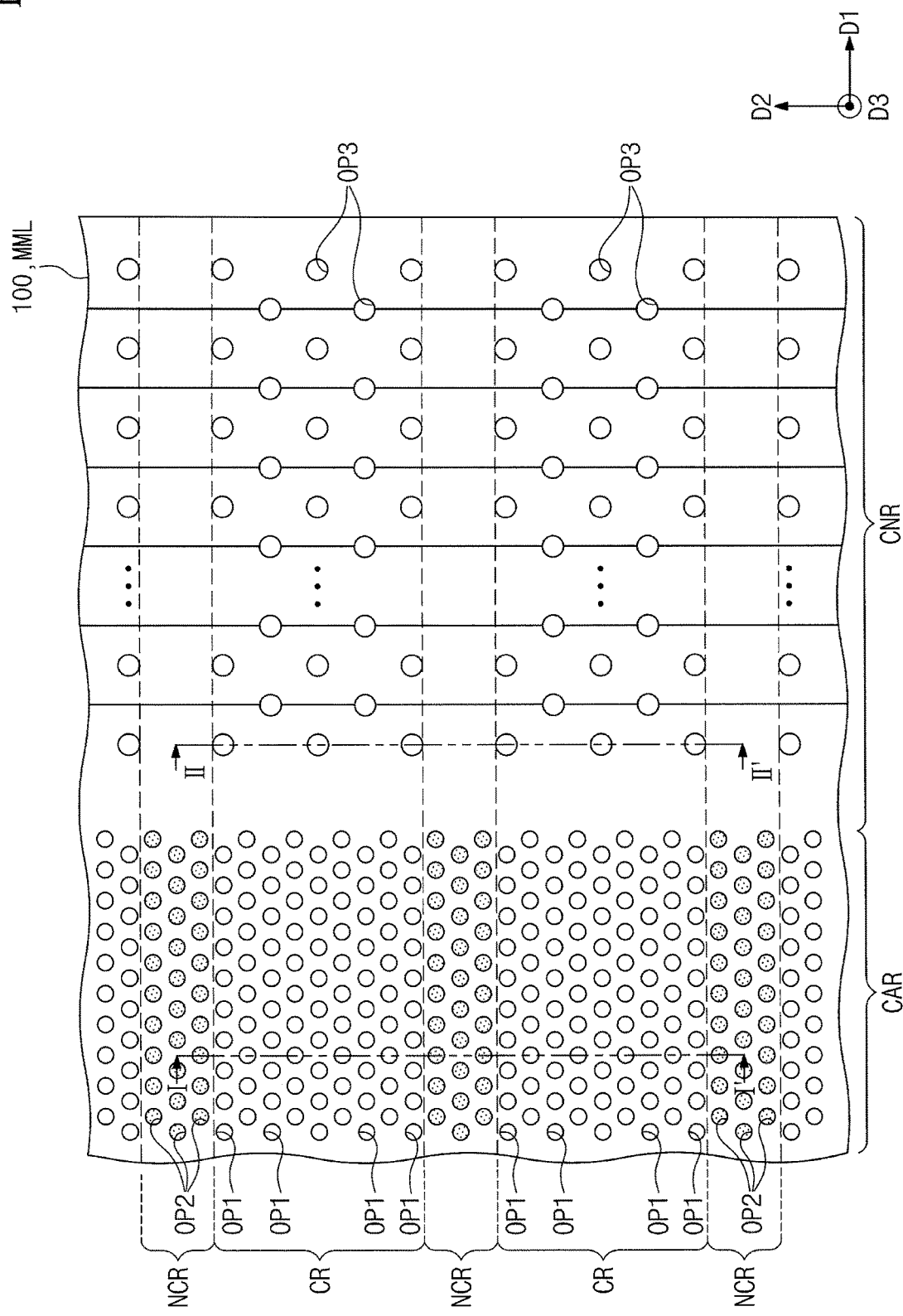
FIG. 2 is a plan view illustrating operations of methods of forming channel holes of a three-dimensional semiconductor memory device according to some embodiments.

FIG. 2 is a plan view illustrating operations of methods of forming channel holes of three-dimensional semiconductor memory devices according to some embodiments. FIGS. 3A, 4A, 5A, 6A, 7A, 8A, 9A, 10A, 11A, and 12A are cross-sectional views taken along line I-I' of FIG. 2, illustrating operations of methods of forming channel holes of a three-dimensional semiconductor memory device according to some embodiments. FIGS. 3B, 4B, 5B, 6B, 7B, 8B, 9B, 10B, 11B, and 12B are cross-sectional views taken along line of FIG. 2, illustrating operations of methods of forming channel holes of a three-dimensional semiconductor memory device according to some embodiments.

Figure 3A:
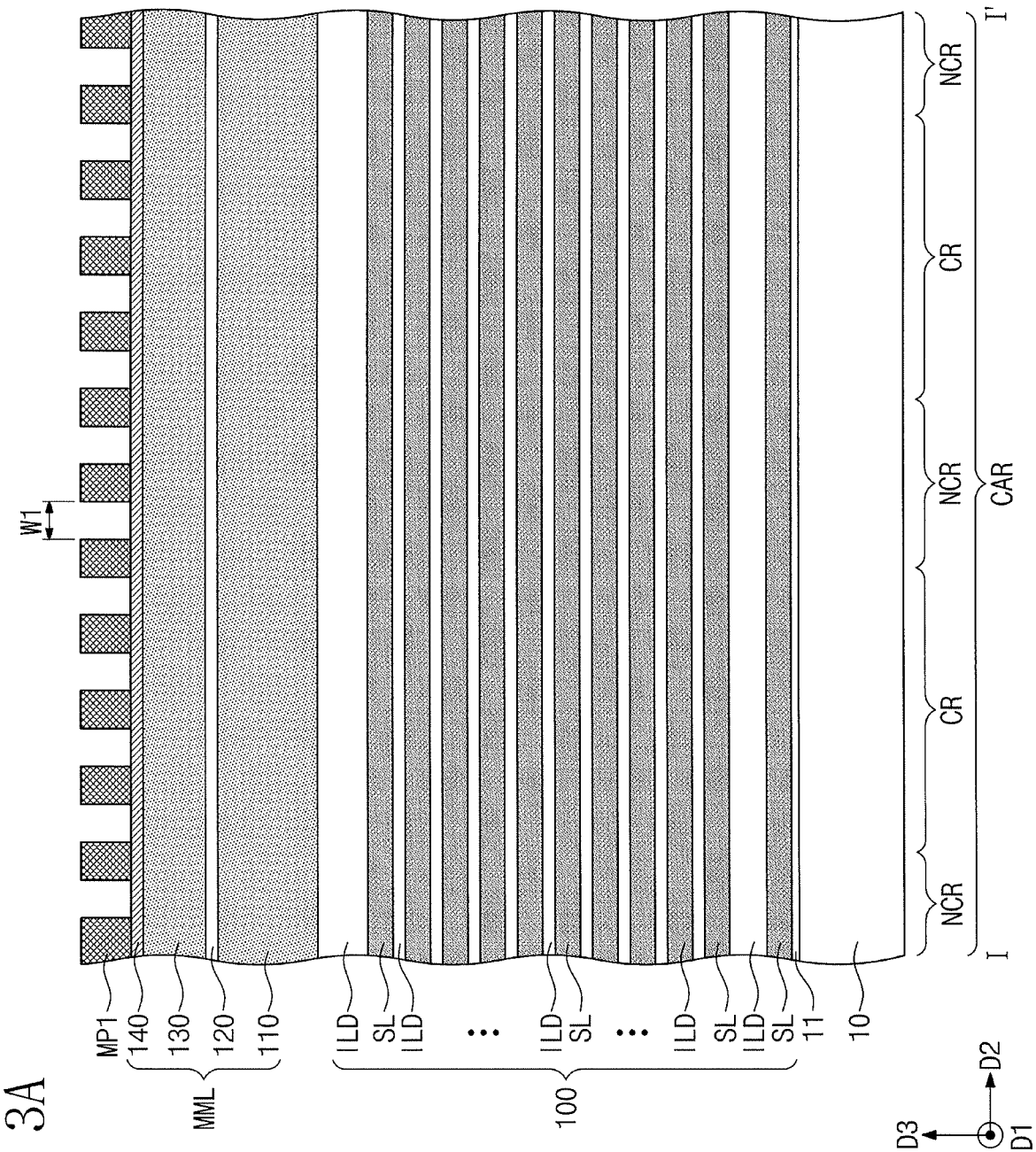
Figure 3B:
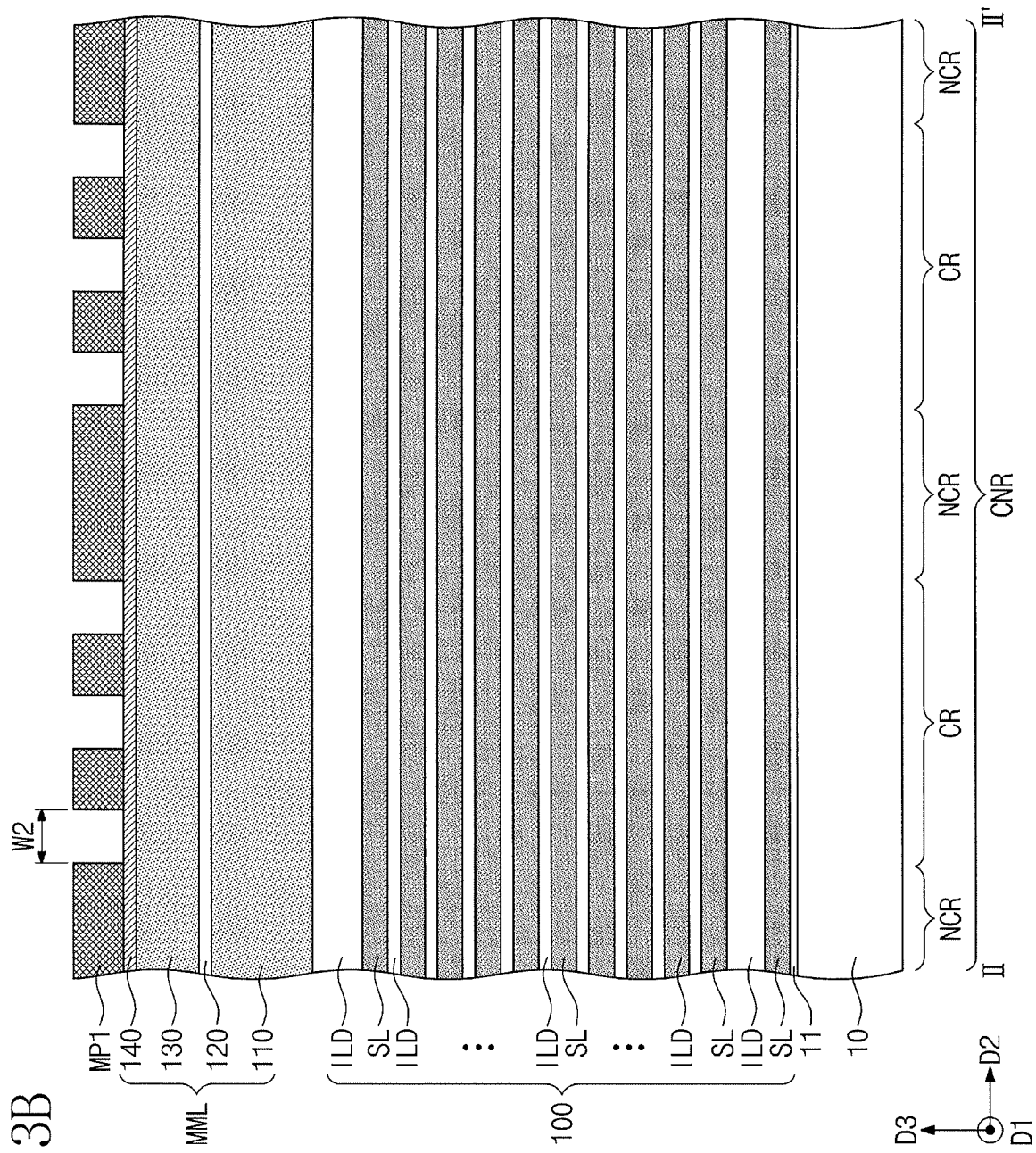

Referring to FIGS. 2, 3A, and 3B, a substrate 10 may include the cell array region CAR and the connection region CNR adjacent to each other in the first direction D1. The cell array region CAR may include channel regions CR and non-channel regions NCR that are alternately arranged in the second direction D2 perpendicular to the first direction D1 and that extend in the first direction D1 into the connection region CNR. The first and second directions D1 and D2 may be parallel to an upper surface of the substrate 10.

The substrate 10 may include a semiconductor material (e.g., a silicon wafer), an insulating material (e.g., a glass), a semiconductor covered by an insulation material, and/or a conductive layer. For example, the substrate 10 may be a silicon wafer of a first conductivity type.

A mold structure 100 may be formed on the substrate 10. The mold structure 100 may include a plurality of sacrificial layers SL and a plurality of insulation layers ILD repeatedly and alternately stacked on the substrate 10 in the third direction D3 vertical to the upper surface of the substrate 10. An interfacial insulation layer 11 may be formed between the substrate 10 and a lowermost one of the sacrificial layers SL. In some embodiments, the mold structure 100 may further include the interfacial insulation layer 11. An uppermost one of the insulation layers ILD may be thicker than others of the insulation layers ILD. The sacrificial layers SL may be formed of a material different from the insulation layers ILD. For example, the sacrificial layers SL may be formed of silicon nitride, and the insulation layers ILD may be formed of silicon oxide. The insulation layers ILD and sacrificial layers SL may be stacked to have a stepped structure in the connection region CNR. A height of the stepped structure of the mold structure 100 in the connection region CNR may be regularly decreased in a direction away from the cell array region CAR.

A multilayered mask layer MML may be on the mold structure 100. The multilayered mask layer MML may include a first mask layer 110, an etch stop layer 120, a second mask layer 130, and a hard mask layer 140 sequentially stacked on the mold structure 100.

The first and second mask layers 110 and 130 may be formed of a same material. The etch stop layer 120 and the hard mask layer 140 may be formed of a material having an etch selectivity with respect to the material of the first and second mask layers 110 and 130. The first mask layer 110 may be thicker than the second mask layer 130. The first and second mask layers 110 and 130 may be formed of, e.g., an amorphous carbon layer (ACL) or a spin on hardmask (SOH) layer. The SOH layer may include a carbon-based SOH layer or a silicon-based SOH layer. The etch stop layer 120 may be, e.g., a silicon oxide layer. The hard mask layer 140 may be, e.g., a silicon nitride layer or a silicon oxynitride layer.

A first photomask pattern MP1 including openings may be formed on the multilayered mask layer MML. The openings of the first photomask pattern MP1 may expose portions of the channel regions CR and portions of the non-channel regions NCR in the cell array region CAR and portions of the channel regions CR in the connection region CNR. The openings of the first photomask pattern MP1 may have a width W2 in the connection region CNR larger than a width W1 in the cell array region CAR. (W1<W2)

Figure 4A:
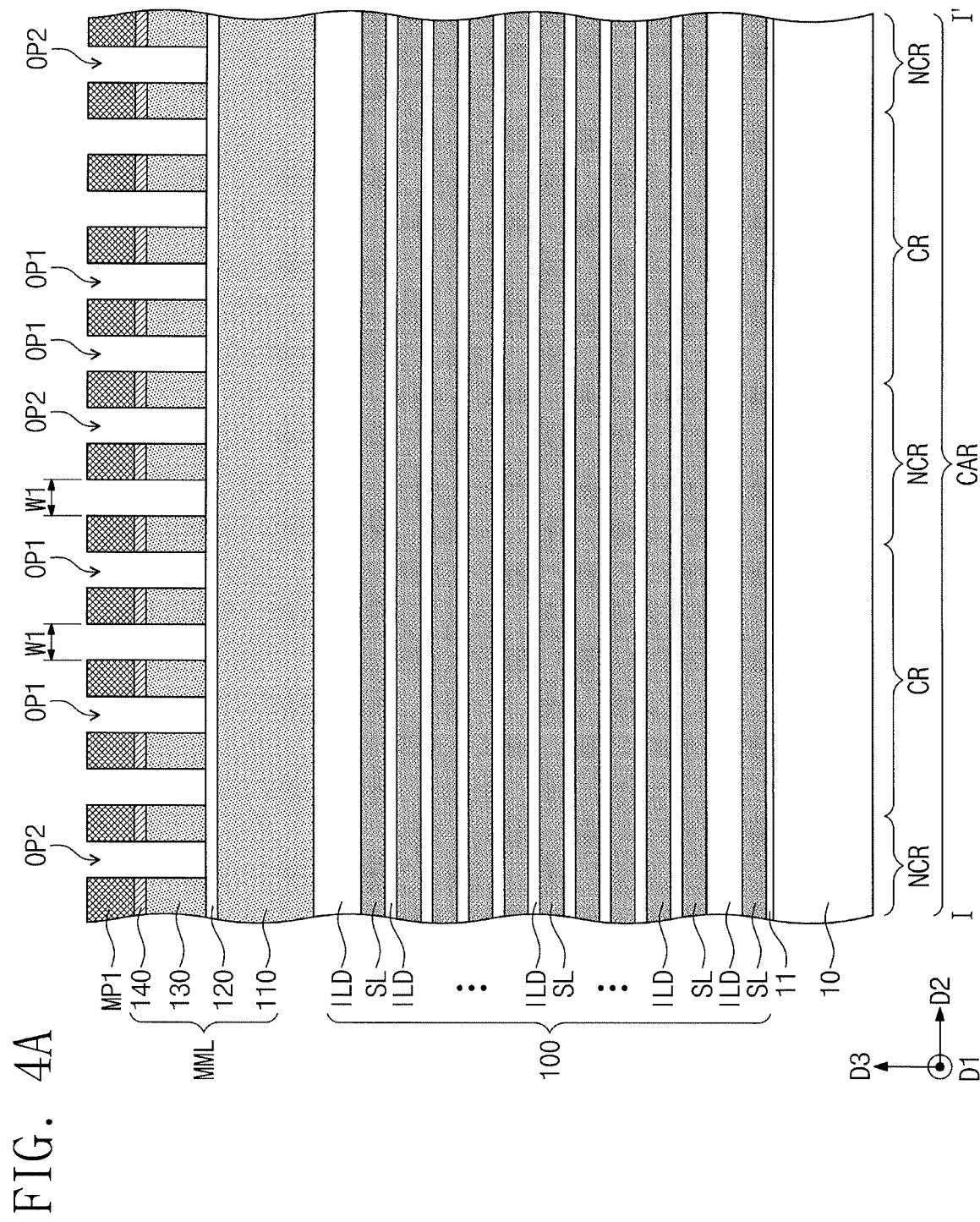
Figure 4B:
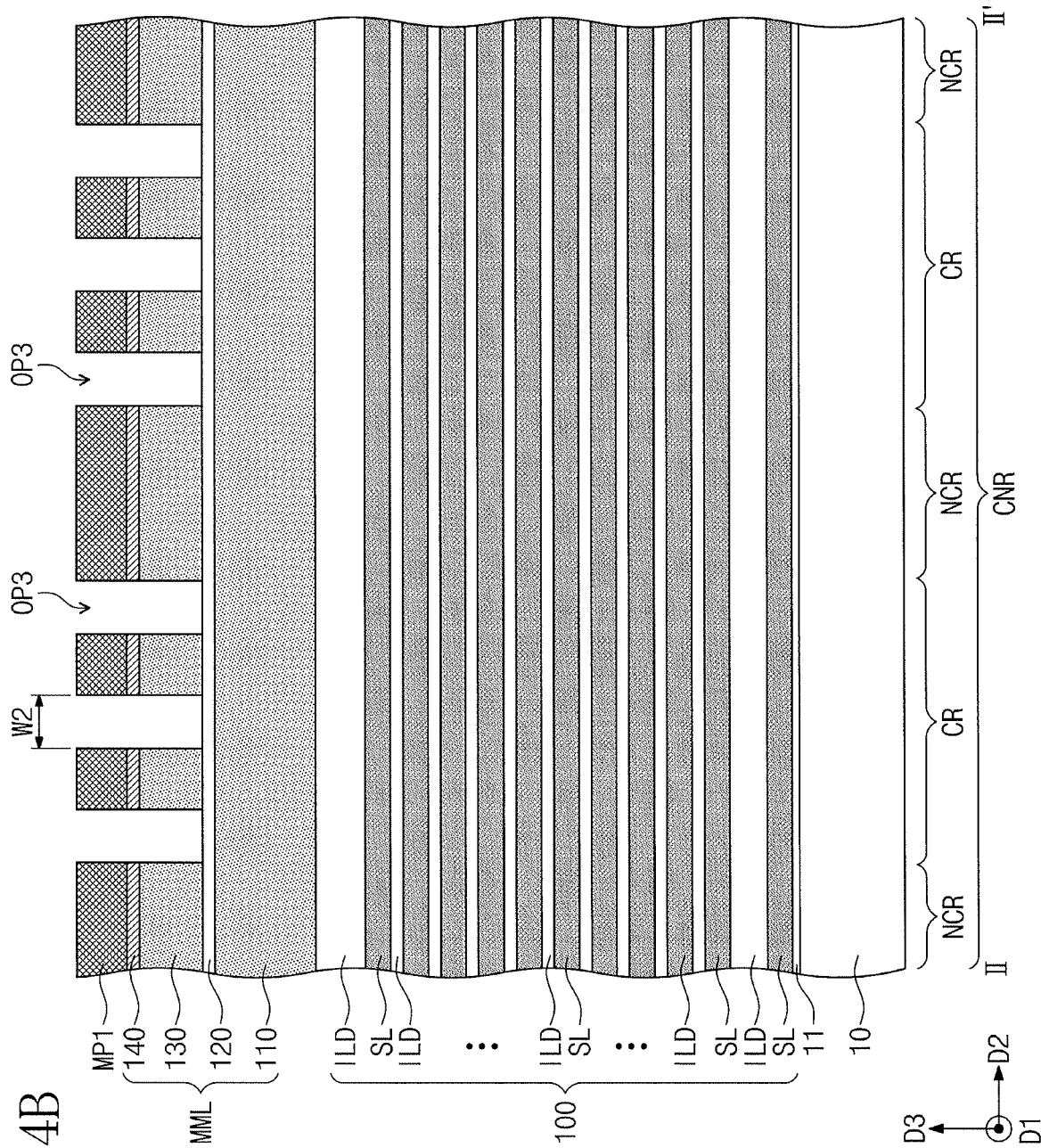

Referring to FIGS. 2, 4A, and 4B, the hard mask layer 140 and the second mask layer 130 may be anisotropically etched using the first photomask pattern MP1 as an etch mask. Thus, first, second, and third openings OP1, OP2, and OP3 may be formed to penetrate the hard mask layer 140 and the second mask layer 130 and to expose the etch stop layer 120.

For example, the first openings OP1 may be formed in the channel regions CR in the cell array region CAR. The second openings OP2 may be formed in the non-channel regions NCR in the cell array region CAR. The third openings OP3 may be formed in the channel regions CR in the connection region CNR.

The first openings OP1 may be arranged to form a plurality of rows parallel to one another in the first direction D1. The first openings OP1 of adjacent rows may be offset from each other in the second direction D2. The second openings OP2 may be arranged in the non-channel regions NCR in the cell array region CAR to form a plurality of rows parallel to one another in the first direction D1. In some embodiments, the second openings OP2 in a row may be staggered from the second openings OP2 in adjacent ones of the parallel rows.

Each of the first openings OP1 and each of the second openings OP2 may have substantially the same first width W1. In some embodiments, a width of each of the second openings OP2 may be smaller than the width W1 of each of the first openings OP1. A distance between adjacent first openings OP1 may be substantially the same as a distance between adjacent second openings OP2. The distance between the adjacent first openings OP1 may be substantially the same as a distance between one of the first openings OP1 and one of the second openings OP2 that are adjacent to each other.

Each of the third openings OP3 may have a second width W2 greater than the first width W1. In some embodiments, the second width W2 of each of the third openings OP3 may be substantially the same as the first width W1 of each of the first openings OP1. A distance between adjacent third openings OP3 may be greater than the distance between the adjacent first openings OP1. The hard mask layer 140 may not be exposed by the first photomask pattern MP1 in the non-channel region NCR in the connection region CNR.

In FIG. 2, the first openings OP1 are illustrated as being arranged in nine rows in the second direction D2 in each channel region CR, but the inventive concepts are not limited thereto. For example, the first openings OP1 may be arranged in more or fewer rows, such as four rows, eight rows, or ten rows, in the second direction D2. In each non-channel region NCR, the second openings OP2 are illustrated as being arranged in three rows in the second direction D2, but the inventive concepts are not limited thereto. For example, the second openings OP2 may be arranged in more or fewer rows, such as one row, two rows, or four rows, in the second direction D2.

After forming the first to third openings OP1, OP2, and OP3, the first photomask pattern MP1 may be removed by an ashing process and/or a strip process.

Figure 5A:
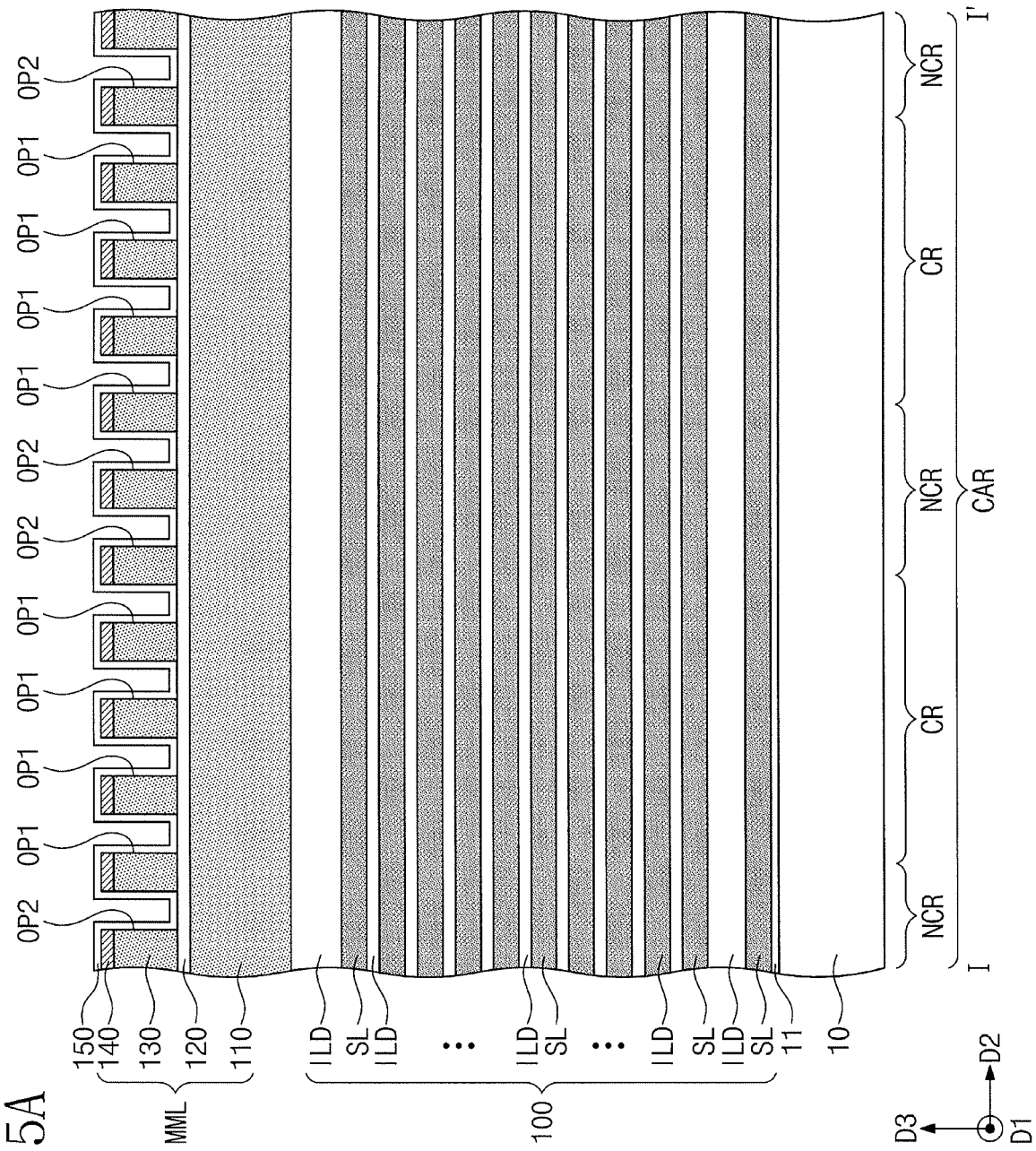
Figure 5B:
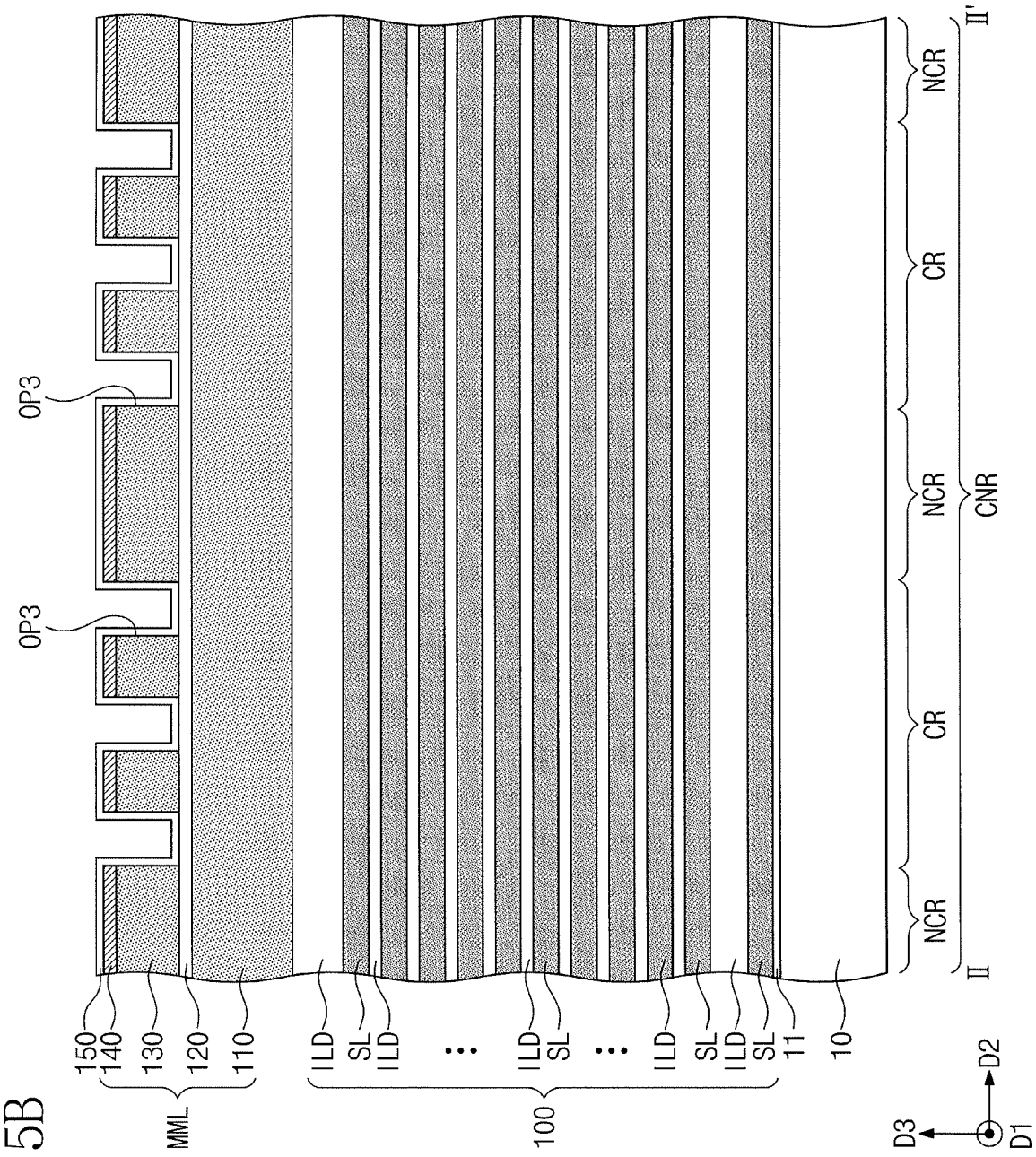

Referring to FIGS. 2, 5A, and 5B, a first buffer layer 150 may be formed to cover inner surfaces of the first to second openings OP1, OP2, and OP3 with a uniform thickness. The first buffer layer 150 may include a material having an etch selectivity with respect to the second mask layer 130 and the hard mask layer 140. In some embodiments, the first buffer layer 150 may include the same material as the etch stop layer 120. For example, the first buffer layer 150 may be a silicon oxide layer and may be formed by an atomic layer deposition (ALD) process.

Figure 6A:
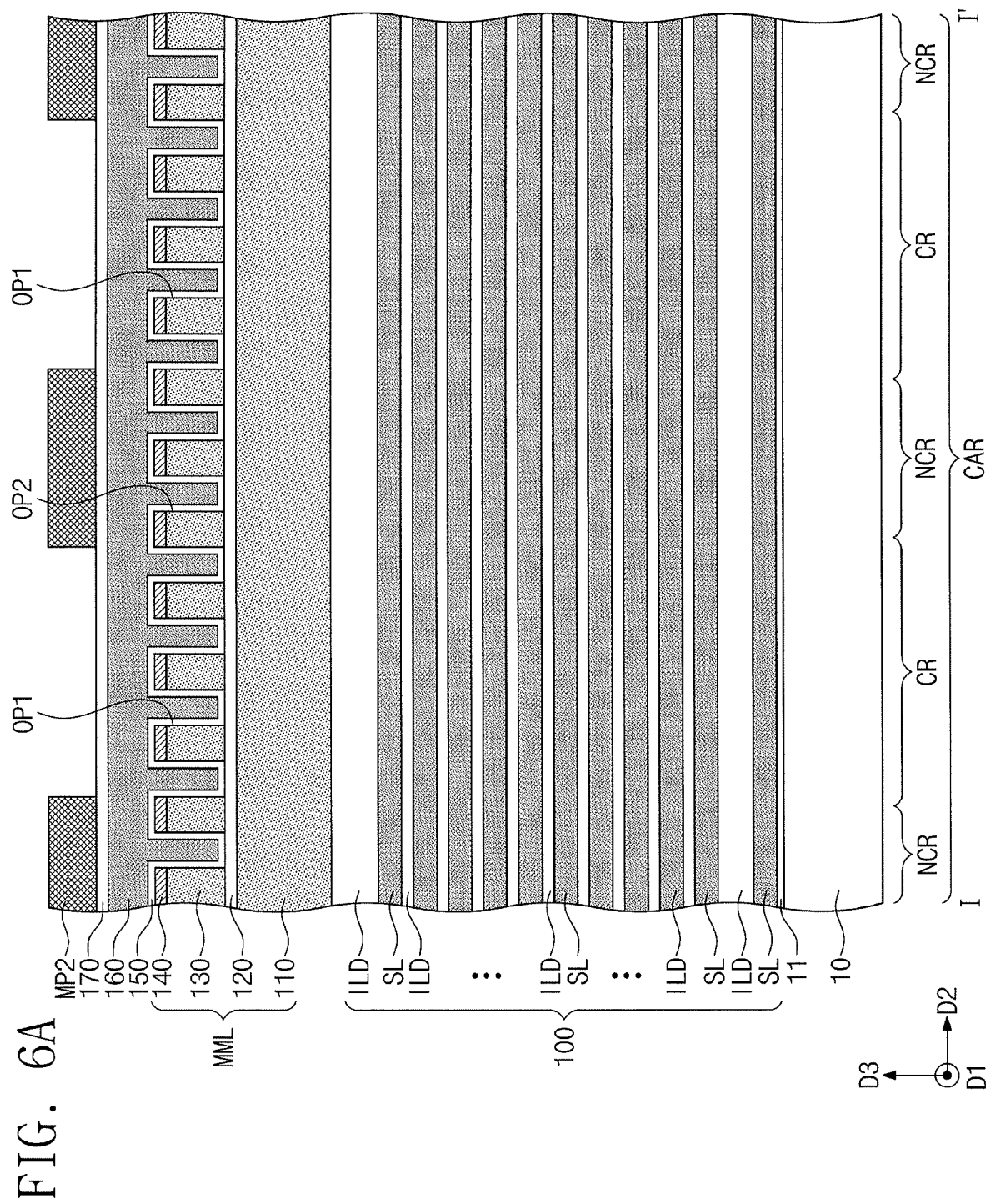
Figure 6B:
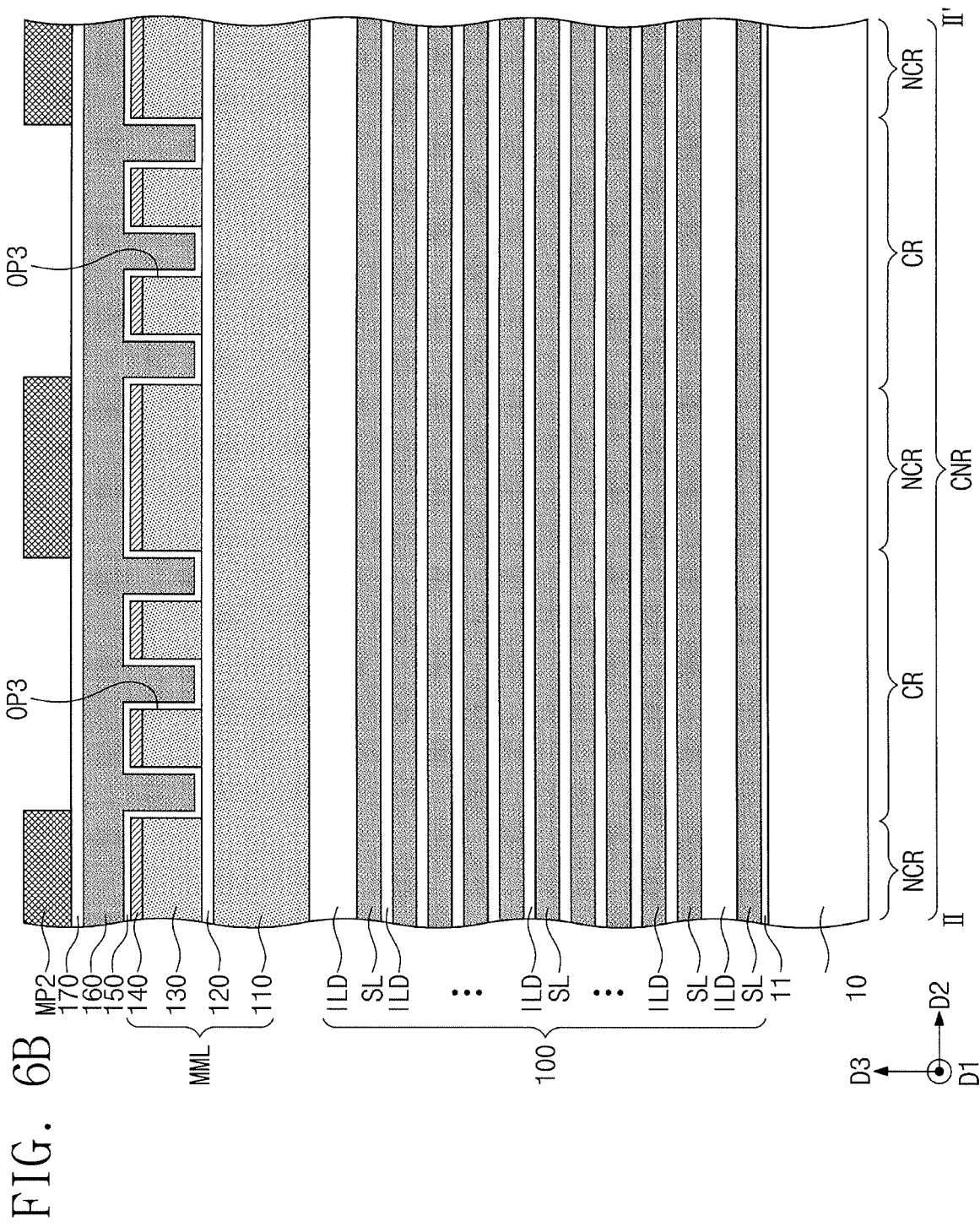

Referring to FIGS. 2, 6A, and 6B, a sacrificial mask layer 160 may be formed to fill the first to third openings OP1, OP2, and OP3 having the first buffer layer 150. In some embodiments, the sacrificial mask layer 160 may include the same material as the first mask layer 110. For example, the sacrificial mask layer 160 may be an amorphous carbon layer (ACL) or a spin on hardmask (SOH) layer.

A second buffer layer 170 may be formed on the sacrificial mask layer 160. The second buffer layer 170 may include the same material as the first buffer layer 150.

A second photomask pattern MP2 may be formed on the second buffer layer 170. The second photomask pattern MP2 may have linear shapes extending in the first direction D1 from the cell array region CAR into the connection region CNR and may expose the second buffer layer 170 in the channel regions CR in the cell array region CAR and in the connection region CNR.

Figure 7A:
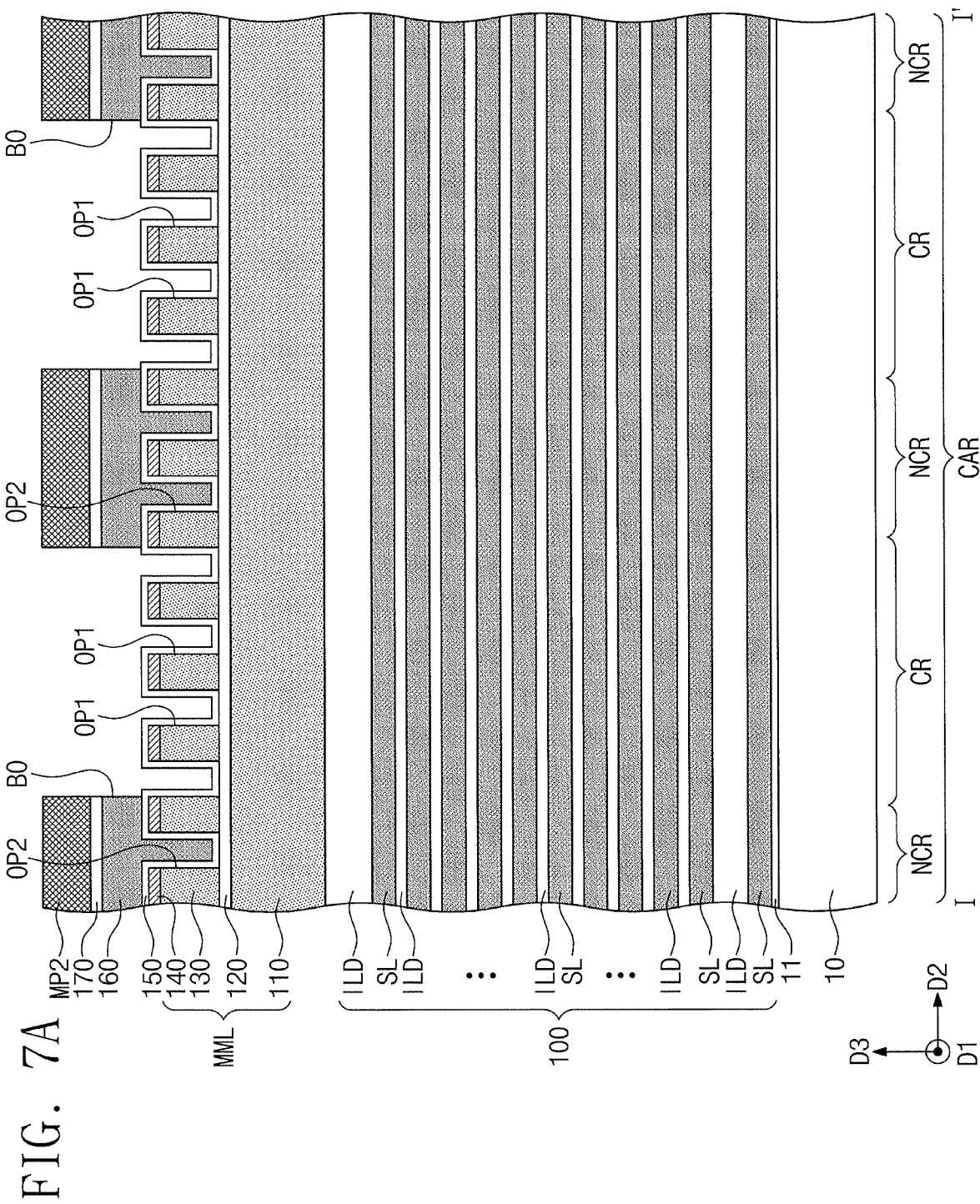
Figure 7B:
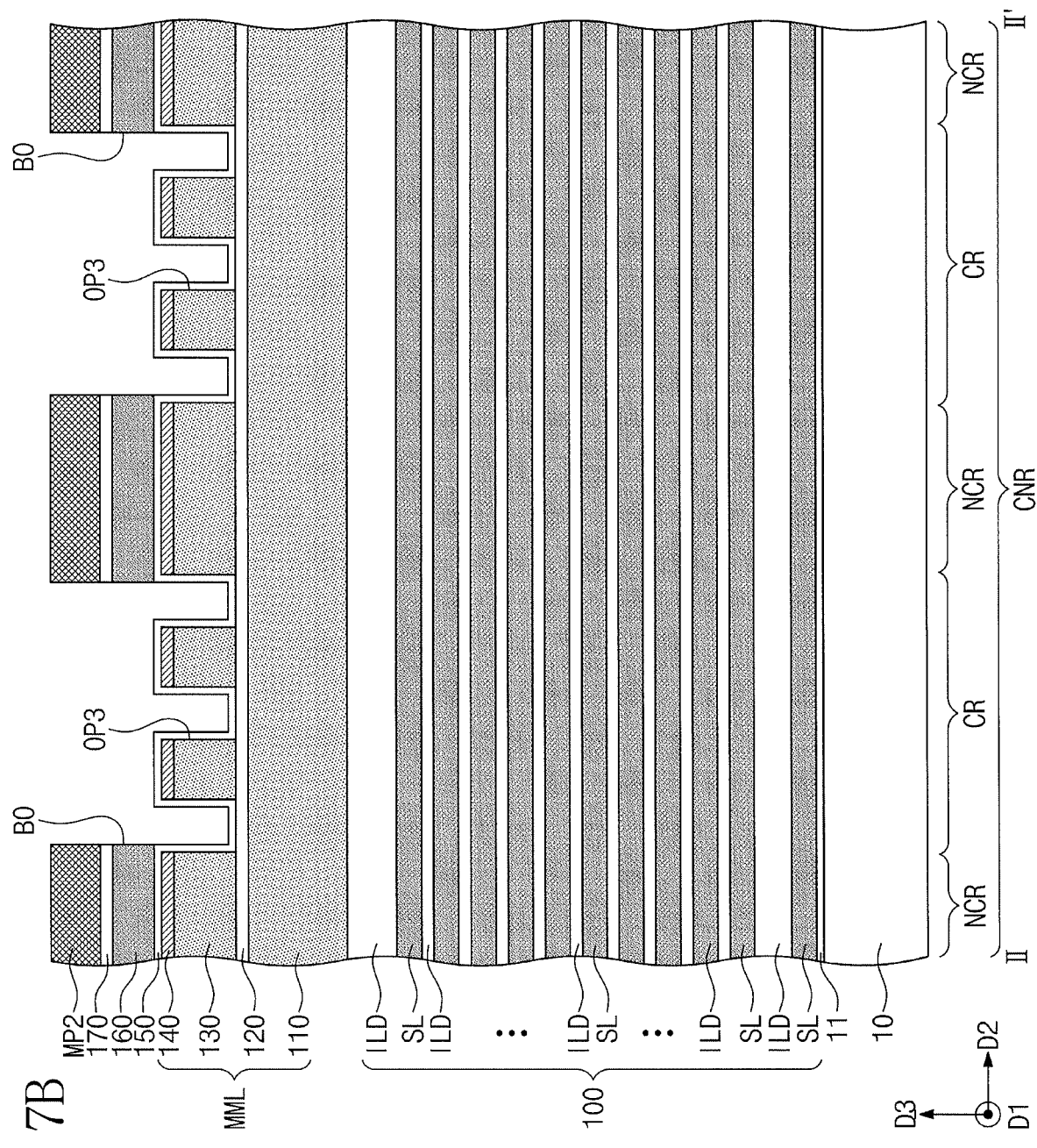

Referring to FIGS. 2, 7A, and 7B, the second buffer layer 170 and the sacrificial mask layer 160 in the channel regions CR may be sequentially anisotropically etched using the second photomask pattern MP2 as an etch mask. Thus, block openings BO may be formed in the second buffer layer 170 and the sacrificial mask layer 160. In the anisotropic etch process for forming the block openings BO, the first buffer layer 150 may be used as an etch stop layer. The block openings BO may each have a linear shape extending in the first direction D1 from the cell array region CAR into the connection region CNR and may expose the first buffer layer 150 covering the inner surfaces of the first openings OP1 and the third openings OP3.

After forming the block openings BO in the sacrificial mask layer 160, the second photomask pattern MP2 may be removed by an ashing process and/or a strip process.

Figure 8A:
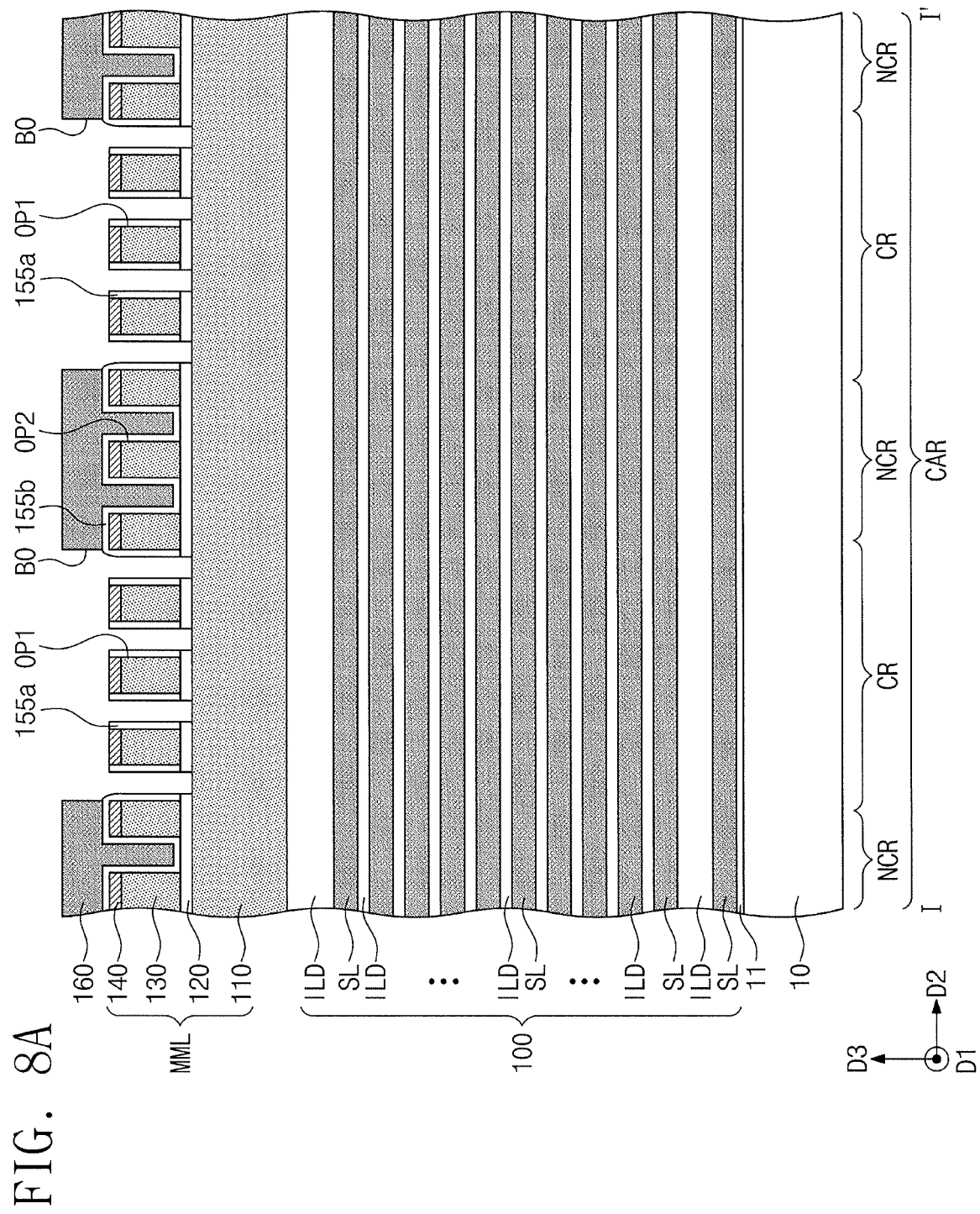
Figure 8B:
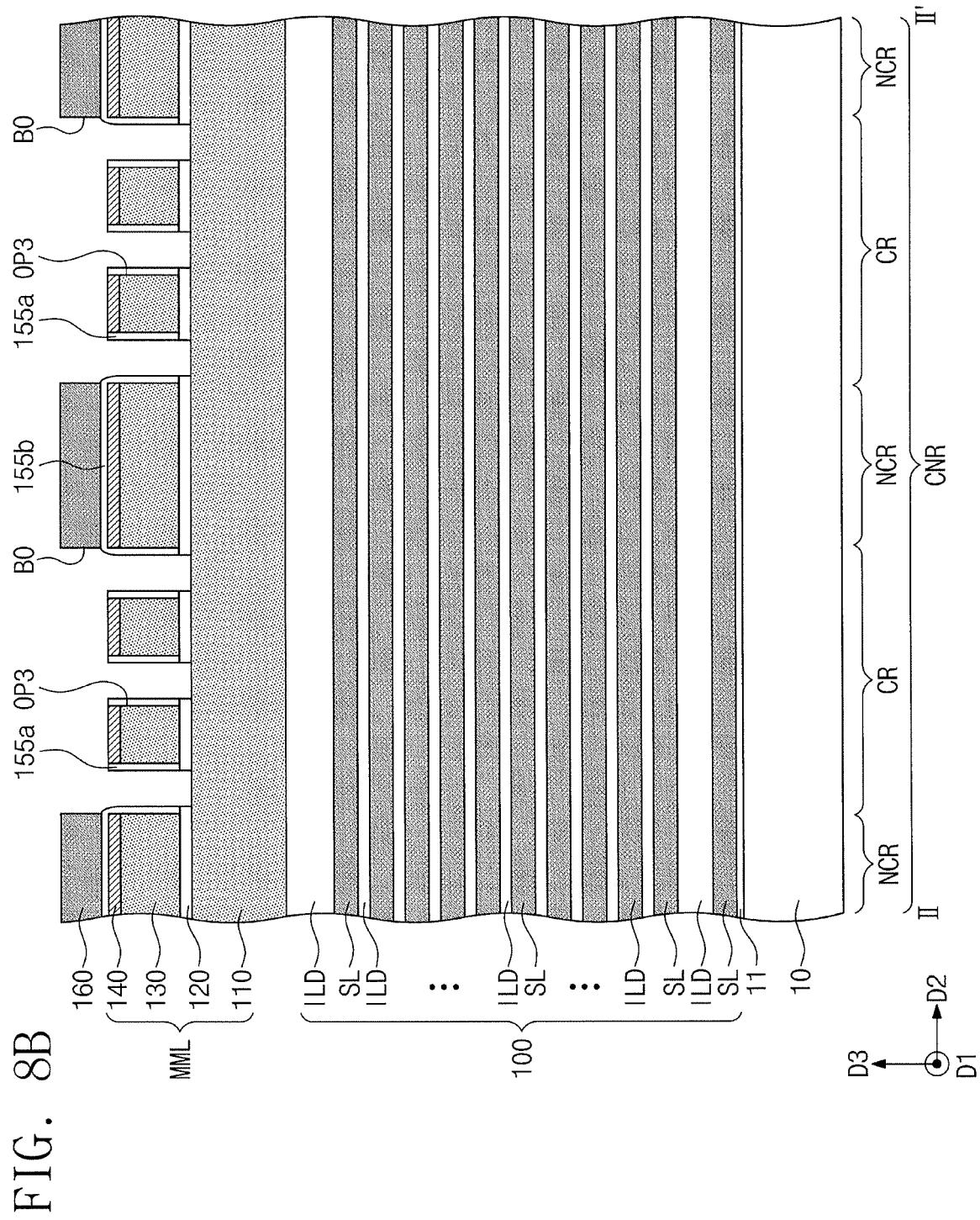

Referring to FIGS. 2, 8A, and 8B, an anisotropic etch process may be performed on the first and second buffer layers 150 and 170 and the etch stop layer 120 using the sacrificial mask layer 160 having the block openings BO as an etch mask. Thus, a first buffer spacer 155a may be formed to cover inner sidewalls of the first and third openings OP1 and OP3 in the channel region CR in the cell array region CAR and in the connection region CNR. During the formation of the first buffer spacer 155a, portions of the first buffer layer 150 may remain as first buffer portions 155b below the sacrificial mask layer 160 in the non-channel regions NCR. The etch stop layer 120 may be etched by over-etching during the formation of the first buffer spacer 155a, thus exposing the first mask layer 110. In addition, the second buffer layer 170 may be removed in the non-channel regions NCR to expose an upper surface of the sacrificial mask layer 160.

Figure 9B:
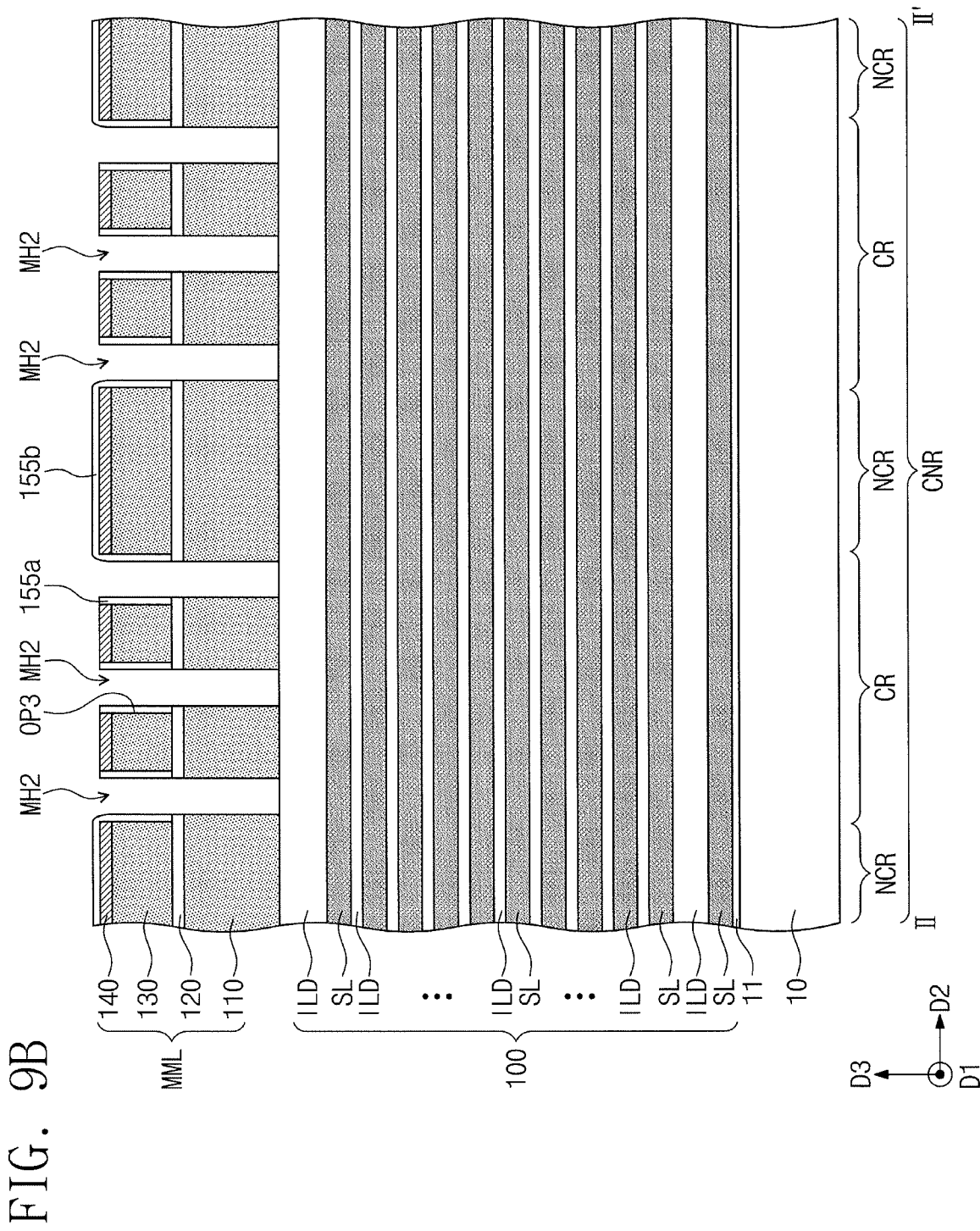

Referring to FIGS. 2, 9A, and 9B, after forming the first buffer spacer 155a, an anisotropic etch process may be performed on the first mask layer 110 using the sacrificial mask layer 160 having the block openings BO and the first buffer spacer 155a as an etch mask. The anisotropic etch process may use an etch recipe for anisotropically etching the first mask layer 110. First and second mask holes MH1 and MH2 may be formed in the first mask layer 110 by the anisotropic etch process to expose portions of the mold structure 100. The first mask holes MH1 may be formed in the channel regions CR in the cell array region CAR. The second mask holes MH2 may be formed in the channel regions CR in the connection region CNR.

The sacrificial mask layer 160 may be removed in the non-channel regions NCR during the anisotropic etch process of forming the first and second mask holes MH1 and MH2, thus exposing the first buffer portions 155b covering the inner and bottom surfaces of the second openings OP2. In some embodiments, the anisotropic etch process of forming the first and second mask holes MH1 and MH2 may expose the etch stop layer 120 under the second openings OP2. Since the first buffer portions 155b in the second openings OP2 and/or the etch stop layer 120 under the second openings OP2 exist during the formation of the first and second mask holes MH1 and MH2, the first mask layer 110 below the second openings OP2 in the non-channel region NCR in the cell array region CAR may be prevented from etching. Therefore, a thickness of the first mask layer 110 in the non-channel region NCR in the cell array region CAR may be maintained. The mold structure 100 may not be exposed in the non-channel region NCR while forming the first and second mask holes MH1 and MH2 in the multilayered mask layer MML. In addition, a level difference in an upper surface of the multilayered mask layer MML in the channel region CR and the non-channel region NCR may be reduced.

Figure 10A:
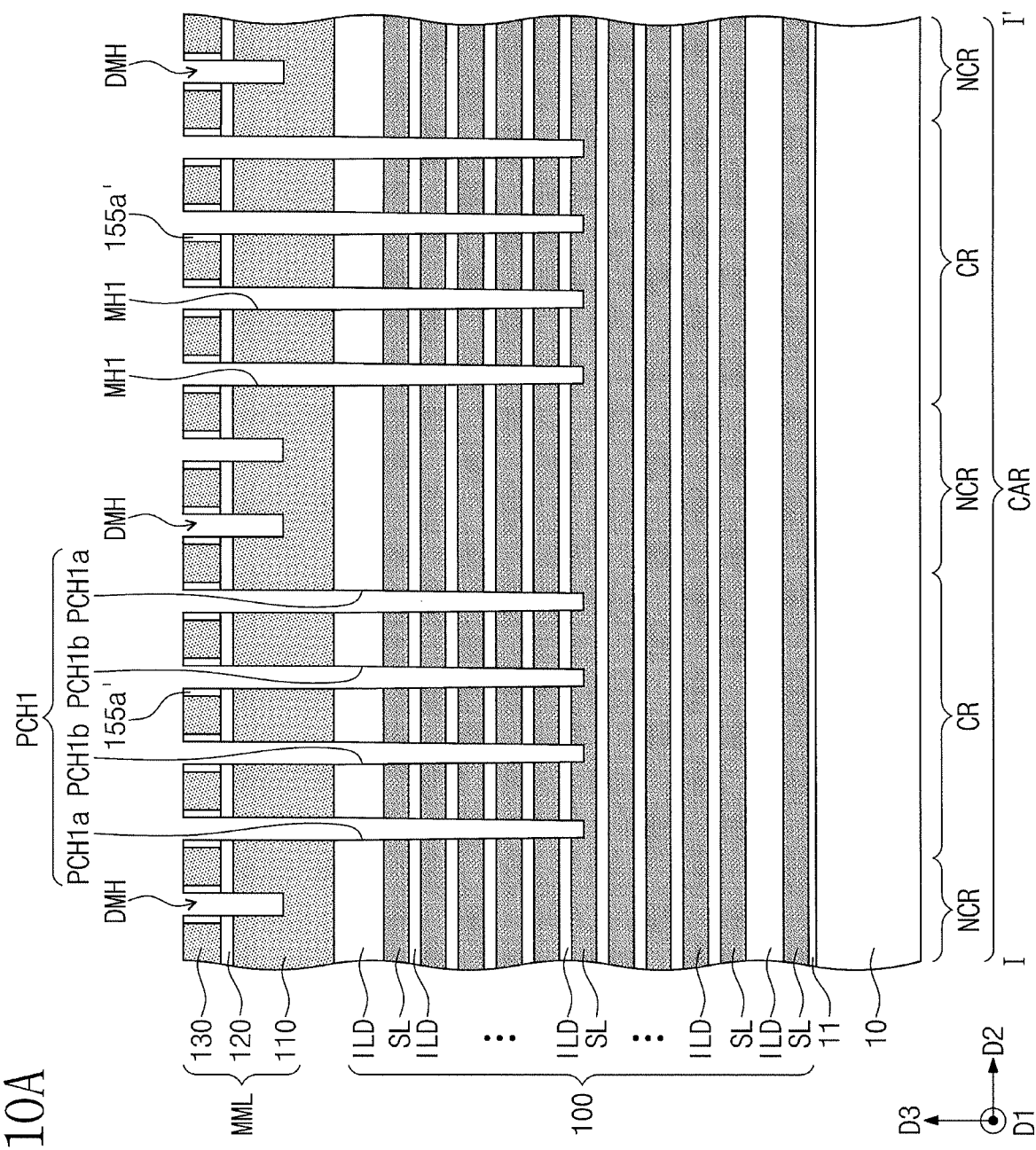
Figure 10B:
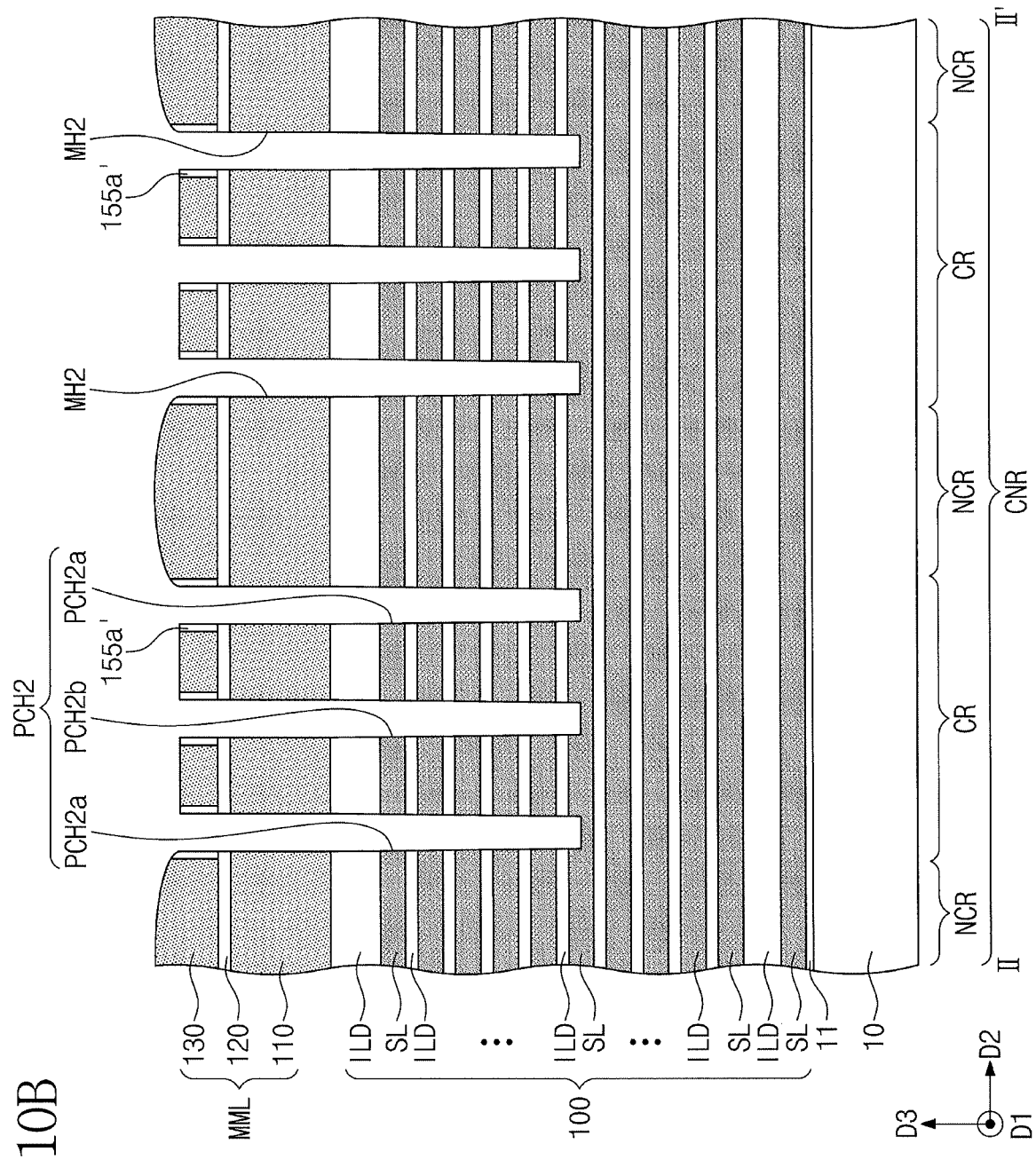

Referring to FIGS. 2, 10A, and 10B, a first anisotropic etch process may be performed on the mold structure 100 exposed by the first and second mask holes MH1 and MH2. The first anisotropic etch process may use an etch recipe for continuously anisotropically etching the insulation layers ILD and the sacrificial layers SL. The first anisotropic etch process may be, e.g., a dry etch process using plasma. For example, etching ions generated by ionization of an etch gas by the plasma may be provided to the substrate 10.

As the first anisotropic etch process is performed on the mold structure 100 using the multilayered mask layer MML, first preliminary channel holes PCH1 and a second preliminary channel holes PCH2 are formed to partially penetrate the mold structure 100. The first preliminary channel holes PCH1 may be formed in the channel regions CR in the cell array region CAR by transcription of the first mask holes MH1. The second preliminary channel holes PCH2 may be formed in the channel regions CR in the connection region CNR by transcription of the second mask holes MH2. A diameter of each of the second preliminary channel holes PCH2 may be greater than a diameter of each of the first preliminary channel holes PCH1.

In the cell array region CAR, the first preliminary channel holes PCH1 may include first outer preliminary channel holes PCH1a adjacent to the non-channel regions NCR and first inner preliminary channel holes PCH1b remote from the non-channel regions NCR compared to the first outer preliminary channel holes PCH1a. In the connection region CNR, the second preliminary channel holes PCH2 may include second outer preliminary channel holes PCH2a adjacent to the non-channel regions NCR and second inner preliminary channel holes PCH2b remote from the non-channel regions NCR compared to the second outer preliminary channel holes PCH2a.

During the first anisotropic etch process against the mold structure 100, the hard mask layer 140 and the first buffer layer 150 on the hard mask layer 140 may be etched, and a thickness of the second mask layer 130 may be reduced. Additionally, in the non-channel regions NCR in the cell array region CAR, portions of the first buffer portions 155b on bottom surfaces of the second openings OP2, and a portion of the etch stop layer 120 and the first mask layer 110 that are below the second openings OP2 may be removed to form dummy mask holes DMH. Accordingly, the multilayered mask layer MML may be formed on the mold structure 100 to have the first and second mask holes MH1 and MH2 penetrating the first and second mask layers 110 and 130 in the channel regions CR and the dummy mask holes DMH penetrating the second mask layer 130 in the non-channel regions NCR. In addition, the multilayered mask layer MML may include buffer spacers 155a' covering sidewalls of the second mask layer 130. The buffer spacers 155a' may cover upper portions of sidewalls of the first and second mask holes MH1 and MH2 and upper portions of sidewalls of the dummy mask holes DMH. Bottom surfaces of the dummy mask holes DMH may be remote from an upper surface of the mold structure 100. A width of each of the dummy mask holes DMH may be substantially equal to or less than a width of each of the first mask holes MH1.

Figure 11A:
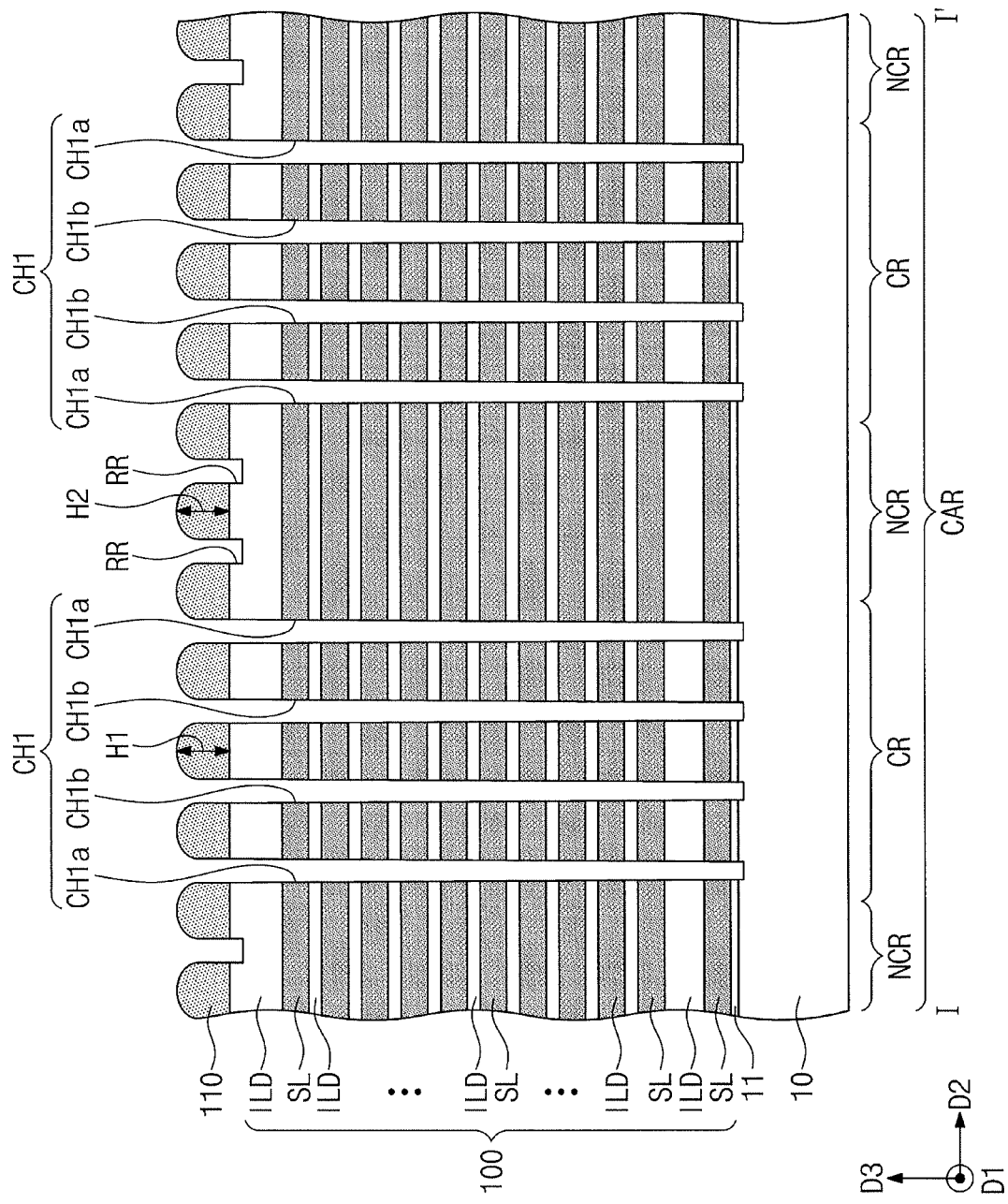
Figure 11B:
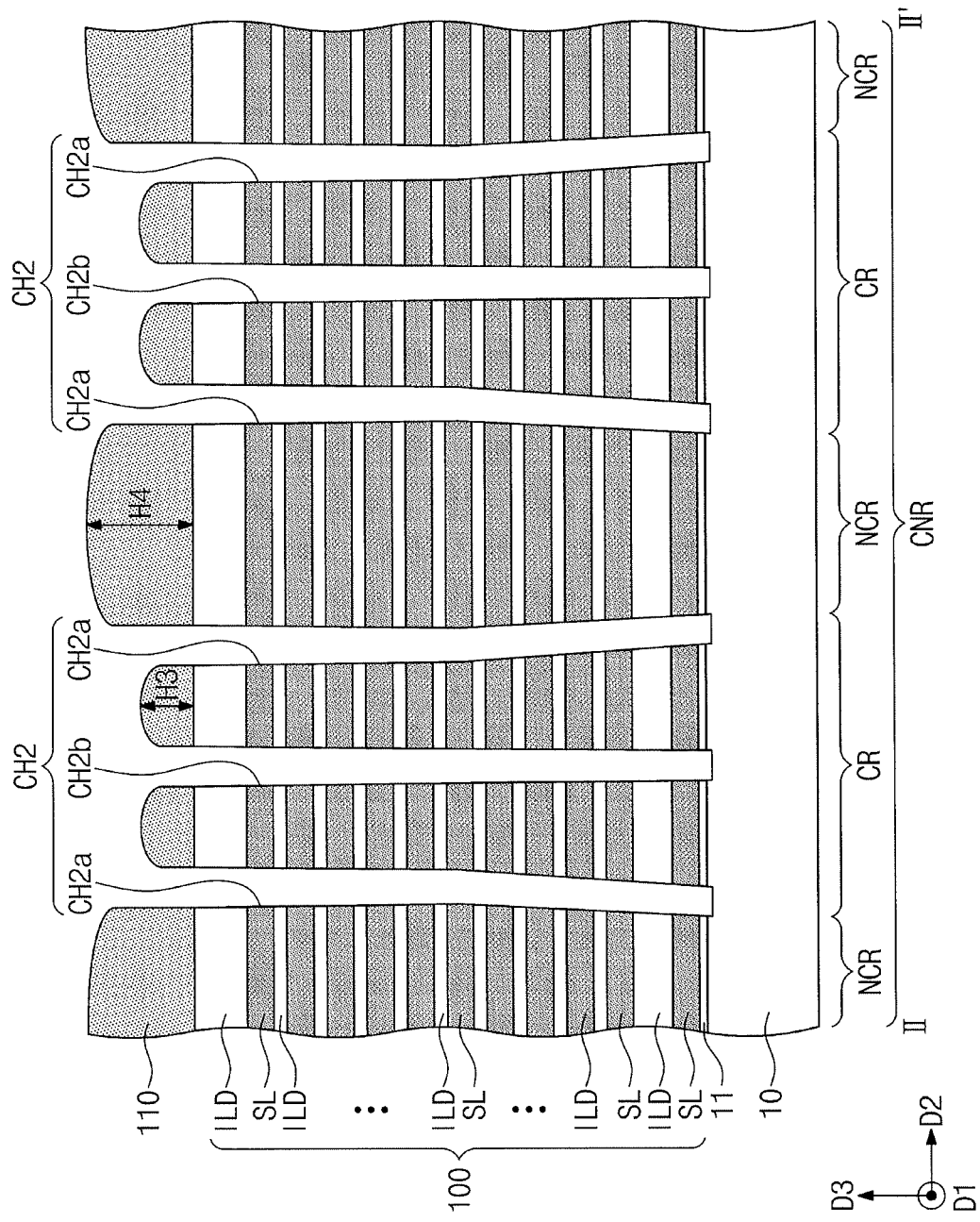

Referring to FIGS. 2, 11A, and 11B, a second anisotropic etch process may be performed on the mold structure 100 using the multilayered mask layer MML having the first and second mask holes MH1 and MH2 and the dummy mask holes DMH as an etch mask to expose portions of the substrate 10. The second anisotropic etch process may be continuously performed at the same conduction as the first anisotropic etch process. Thus, first channel holes CH1 and second channel holes CH2 may be formed to penetrate the mold structure 100 to expose the substrate 10. The first channel holes CH1 may be formed in the channel regions CR in the cell array region CAR. The second channel holes CH2 may be formed in the channel regions CR in the connection region CNR. In the cell array region CAR, the first channel holes CH1 may include first outer channel holes CH1a adjacent to the non-channel regions NCR and first inner channel holes CH1b remote from the non-channel regions NCR compared to the first outer channel holes CH1a. In the connection region CNR, the second channel holes CH2 may include second outer channel holes CH2a adjacent to the non-channel regions NCR and second inner channel holes CH2b remote from the non-channel regions NCR compared to the second outer channel holes CH2a.

In some embodiments, the first and second anisotropic etch processes may be performed by providing the etch ions generated by ionization of the etch gas to the mold structure 100 through the first and second mask holes MH1 and MH2, such that the mold structure 100 may be etched. Since the dummy mask holes DMH are formed in the multilayered layer MML to have the same size and the same arrangement as the first mask holes MH1 in the channel regions CR, an etch condition may be similar in an edge region and a middle region of each of the channel regions CR in the second direction D2, while anisotropically etching the mold structure 100. In other words, while the mold structure 100 is anisotropically etched, a radical flux provided to the first mask holes MH1 in the cell array region CAR may be substantially uniform. Therefore, a size and a shape of each of the first outer channel holes CH1a may be prevented from varying from those of each of the first inner channel holes CH1b. In the channel region CR in the cell array region CAR, the sizes and shapes of the first outer channel holes CH1a and the first inner channel holes CH1b may be substantially the same.

Since dummy mask holes are not formed in the non-channel regions NCR in the connection region CNR, the radical flux may be concentrated on the second mask holes MH2 adjacent to the non-channel regions NCR while the mold structure 100 is anisotropically etched. Thus, as shown in FIG. 11B, in some embodiments, the second outer channel holes CH2a may bend toward the non-channel regions NCR in the connection region CNR in a direction approaching the substrate 10, or each of the second outer channel holes CH2a may have a reduced lower width compared to the second inner channel holes CH2b. Alternatively, in some embodiments, in the channel regions CR in the connection region CNR, the second outer channel holes CH2a and the second inner channel holes CH2b may have the same size and shape.

Furthermore, while forming the first and second channel holes CH1 and CH2, the buffer spacers 155a', the second mask layer 130, and the etch stop layer 120 in the multi-layered mask layer MML may be removed, and the thickness of the first mask layer 110 may be reduced. Since the dummy mask holes DMH is present in the non-channel regions NCR in the cell array region CAR, reduction in the thickness of the first mask layer 110 may be similar across the cell array region CAR. In the cell array region CAR, the first mask layer 110 remaining on the mold structure 100 may have a first thickness H1 in the channel regions CR and may have a second thickness H2 substantially equal to the first thickness H1 in the non-channel regions NCR.

Since, in the connection region CNR, the dummy mask holes are not present in the non-channel regions NCR, the reduction in the thickness of the first mask layer 110 may be greater in the channel regions CR than in the non-channel regions NCR. In the connection region CNR, the first mask layer 110 remaining on the mold structure 100 may have a third thickness H3 in the channel regions CR and may have a fourth thickness H4 greater than the third thickness H3 in the non-channel regions NCR.

Furthermore, while forming the first and second channel holes CH1 and CH2, the first mask layer 110 and a portion of the uppermost insulation layer ILD below the dummy mask holes DMH may be removed. Thus, recess regions RR may be formed in the uppermost insulation layer ILD in the non-channel regions NCR in the cell array region CAR.

Figure 12A:
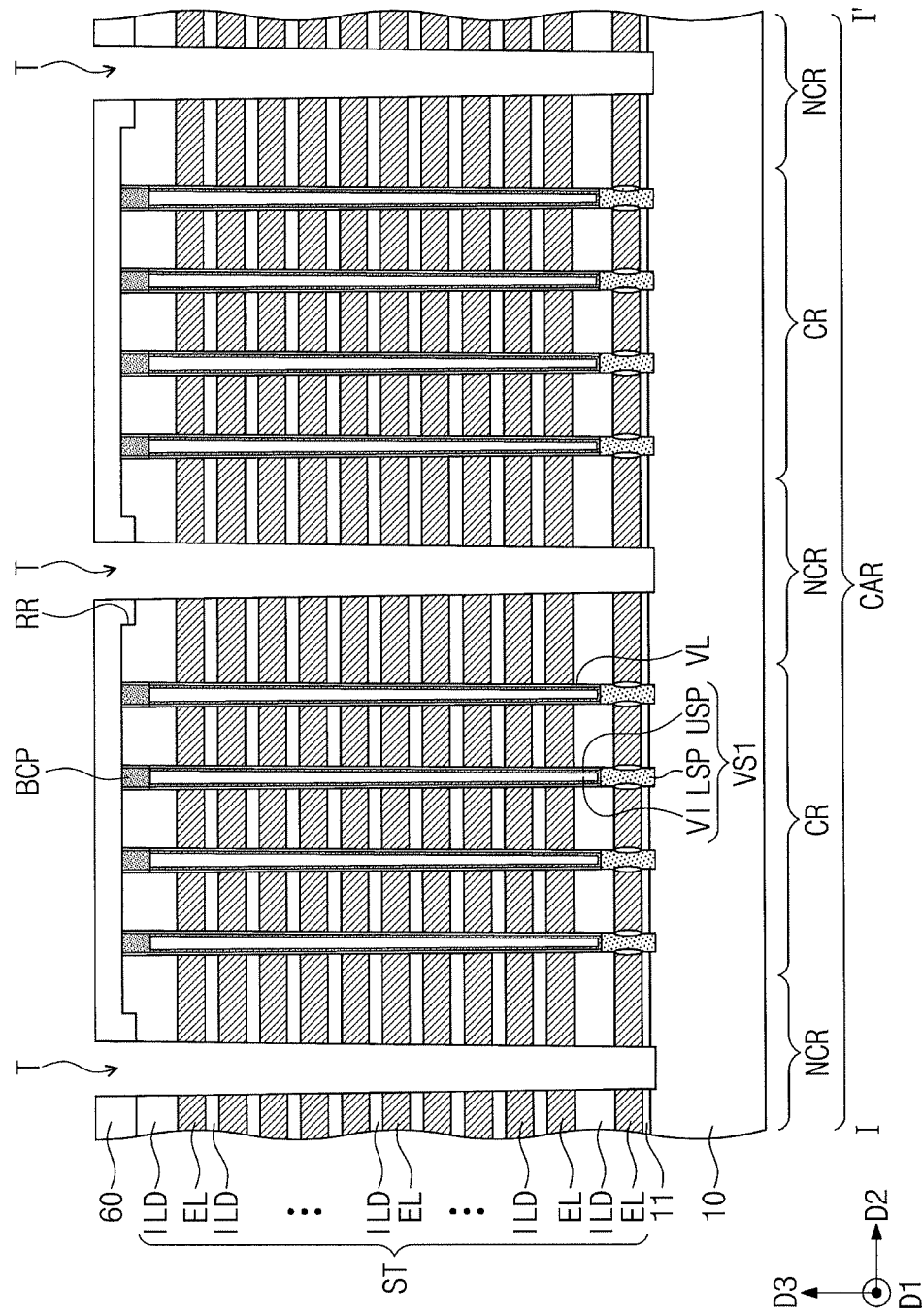

Referring to FIGS. 2, 12A, and 12B, a vertical insulation layer VL and a first vertical channel VS1 may be formed in each of the first channel holes CH1, and the vertical insulation layer VL and a second vertical channel VS2 may be formed in each of the second channel holes CH2.

The first and second vertical channels VS1 and VS2 may be concurrently formed in the first and second channel holes CH1 and CH2, respectively. Each of the first and second vertical channels VS1 and VS2 may include a lower semiconductor pattern LSP and an upper semiconductor pattern USP. In some embodiments, each of the first and second vertical channels VS1 and VS2 may further include a buried insulation layer VI.

The lower semiconductor pattern LSP may be formed by performing a selective epitaxial growth process using the substrate 10 exposed by the first and second channel holes CH1 and CH2 as a seed. Thus, the lower semiconductor pattern LSP may be formed in a pillar form filling a lower portion of each of the first and second channel holes CH1 and CH2. An upper surface of the lower semiconductor pattern LSP may be positioned at a higher level than an upper surface of a lowermost sacrificial layer SL.

The upper semiconductor pattern USP may be formed in the first and second channel holes CH1 and CH2 in which the lower semiconductor pattern LSP and the vertical insulation layer VL are formed. The upper semiconductor pattern USP may be connected to the lower semiconductor pattern LSP and may have a pipe shape or a macaroni shape, of which a bottom end is closed. The buried insulation layer VI may be formed to fill a space defined by the upper semiconductor pattern USP and may be formed of an insulating material or air.

Each of the first and second vertical channels VS1 and VS2 may further include a bit line conductive pad BCP on a top end of the upper semiconductor pattern USP. The bit line conductive pad BCP may be formed of a semiconductor doped with impurities or may be formed of a conductive material.

The vertical insulation layer VL may be on the lower semiconductor pattern LSP and may conformally cover an inner sidewall of an upper portion of each of the first and second channel holes CH1 and CH2. The vertical insulation layer VL may have a pipe shape or a macaroni shape. The vertical insulation layer VL may include a tunnel insulation layer, a charge storage layer, and a blocking insulation layer as a memory element of an NAND flash memory device. The charge storage layer may include a trap insulation layer or an insulation layer containing conductive nano dots.

After forming the first and second vertical channels VS1 and VS2, trenches T may be formed to penetrate the mold structure 100 in the non-channel regions NCR to expose the substrate 10. The trenches T may extend in the first direction D1 and may be spaced apart from each other in the second direction D2.

The trenches T may be formed by forming a first interlayer insulation layer 60 covering upper surfaces of the first and second vertical channels VS1 and VS2, forming a mask pattern defining planar locations of the trenches T on the first interlayer insulation layer 60, and anisotropically etching the first interlayer insulation layer 60 and the mold structure 100 using the mask pattern as an etch mask. As the trenches T are formed, the mold structure 100 may be divided into a plurality of sub-mold structures, and thus the substrate 10 between the sub-mold structures may be exposed. Additionally, sidewalls of the sacrificial layers SL and the insulation layers ILD may be exposed by the trenches T.

After removing the sacrificial layers SL exposed by the trenches T, electrodes EL may be formed in hollow spaces between the insulation layers ILD. Before forming the electrodes EL, a horizontal insulation layer (see, e.g., HL of FIG. 15A) may be formed to conformally cover inner surfaces of the hollow spaces defined between the insulation layers ILD. As such, as the sacrificial layers SL are replaced with the electrodes EL, stack structures ST, each of which includes the insulation layers ILD and the electrodes EL that are alternately stacked, may be formed on the substrate 10.

A three-dimensional semiconductor memory device formed using the above described methods of fabricating a three-dimensional semiconductor memory device will be described with reference to FIGS. 13, 14A to 14D, 15A, and 15B.

Figure 13:
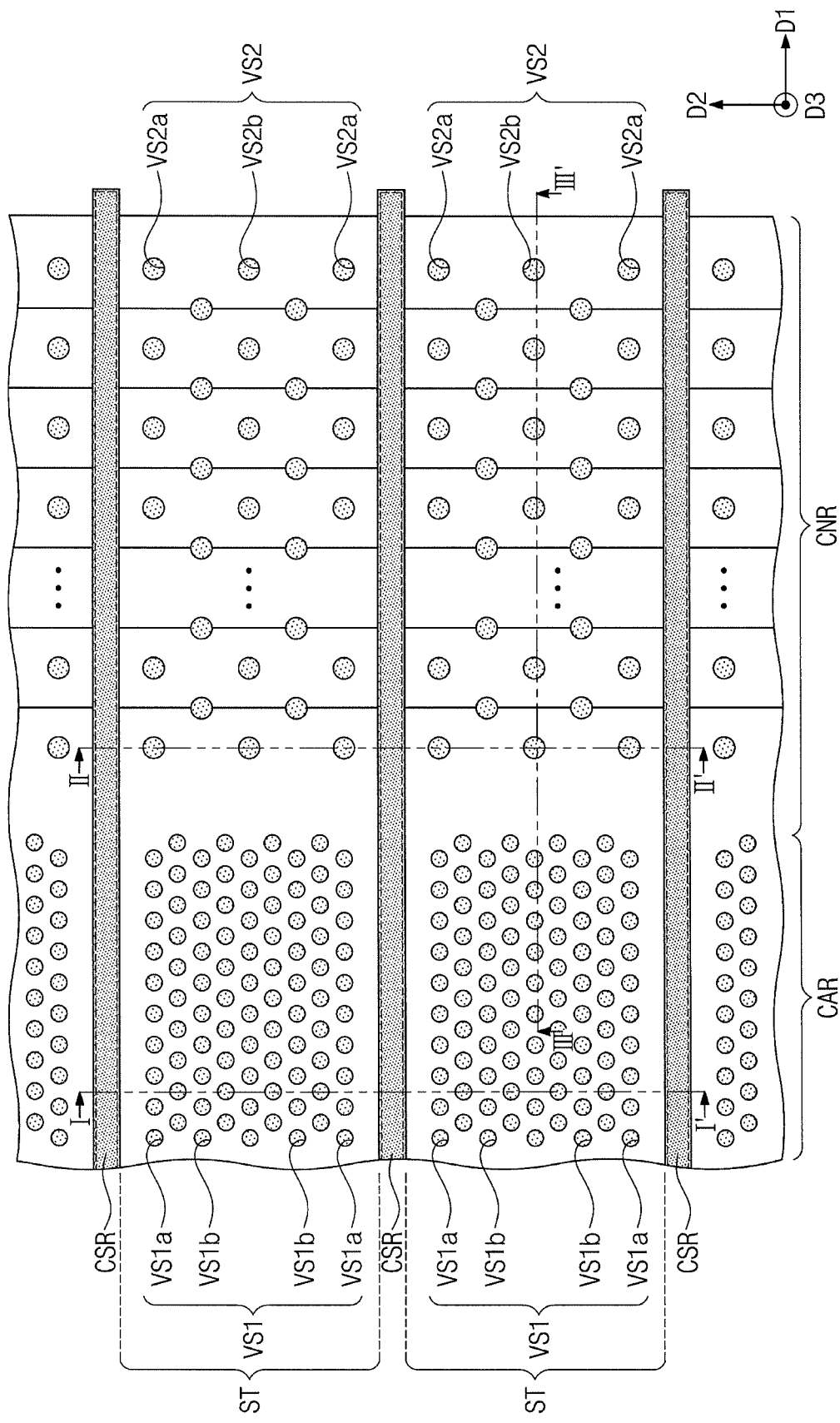
FIG. 13 is a plan view illustrating a three-dimensional semiconductor memory device according to some embodiments.
Figure 14A:
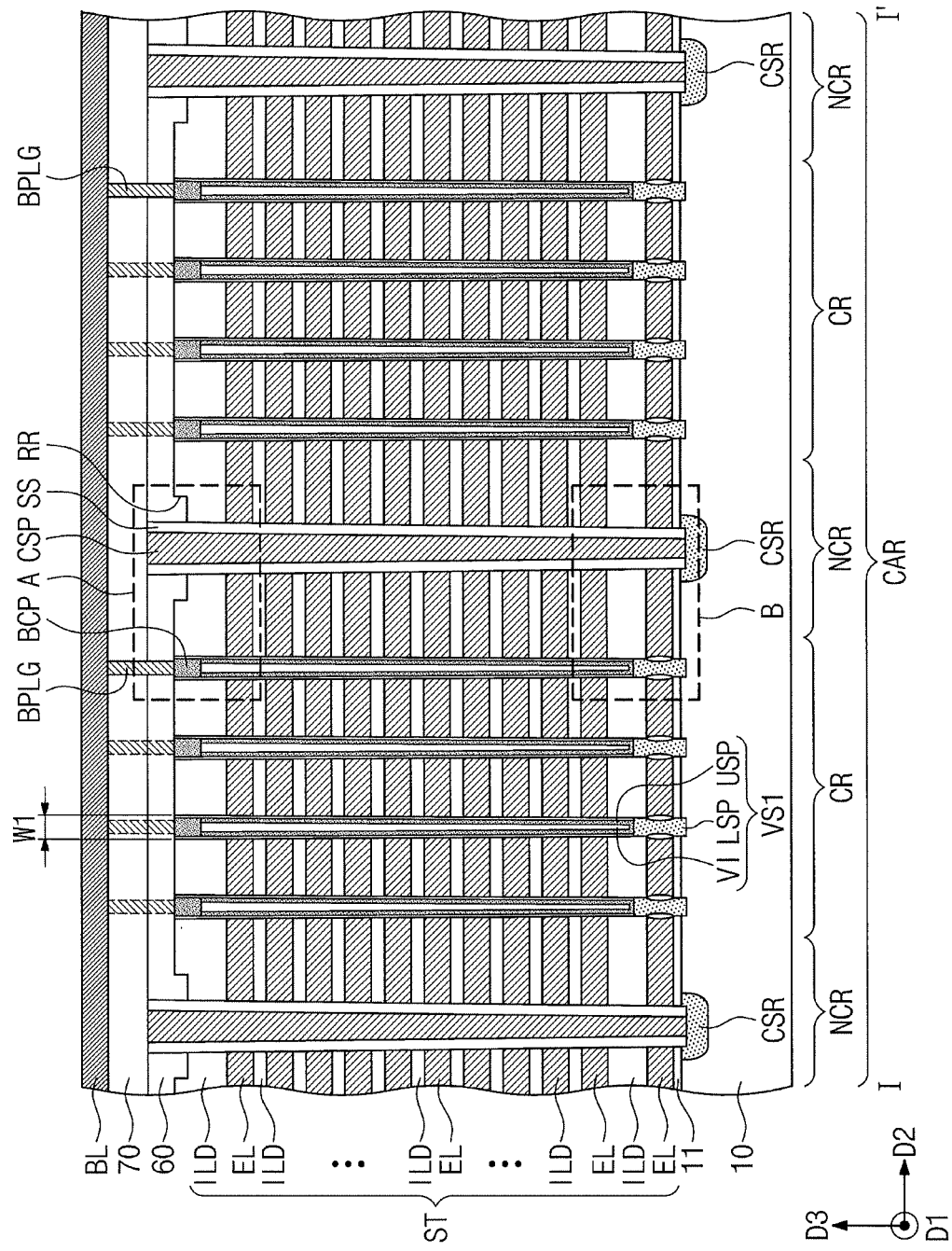
FIG. 14A is a cross-sectional view taken along line I-I' of FIG. 13, illustrating a three-dimensional semiconductor memory device according to some embodiments.
Figure 14B:
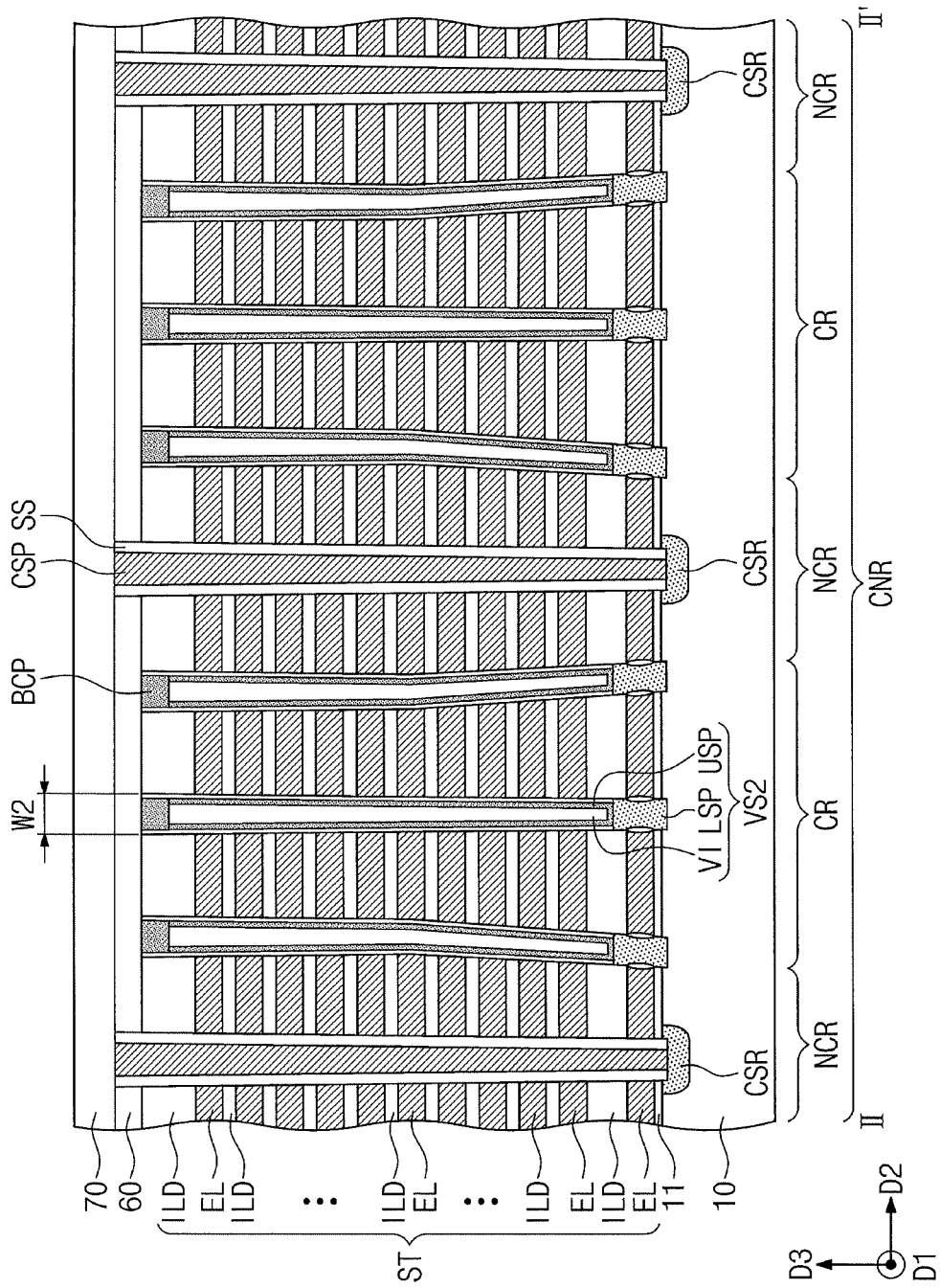
FIGS. 14B and 14C are cross-sectional views taken along line II-IF of FIG. 13, illustrating a three-dimensional semiconductor memory device according to some embodiments.
Figure 14C:
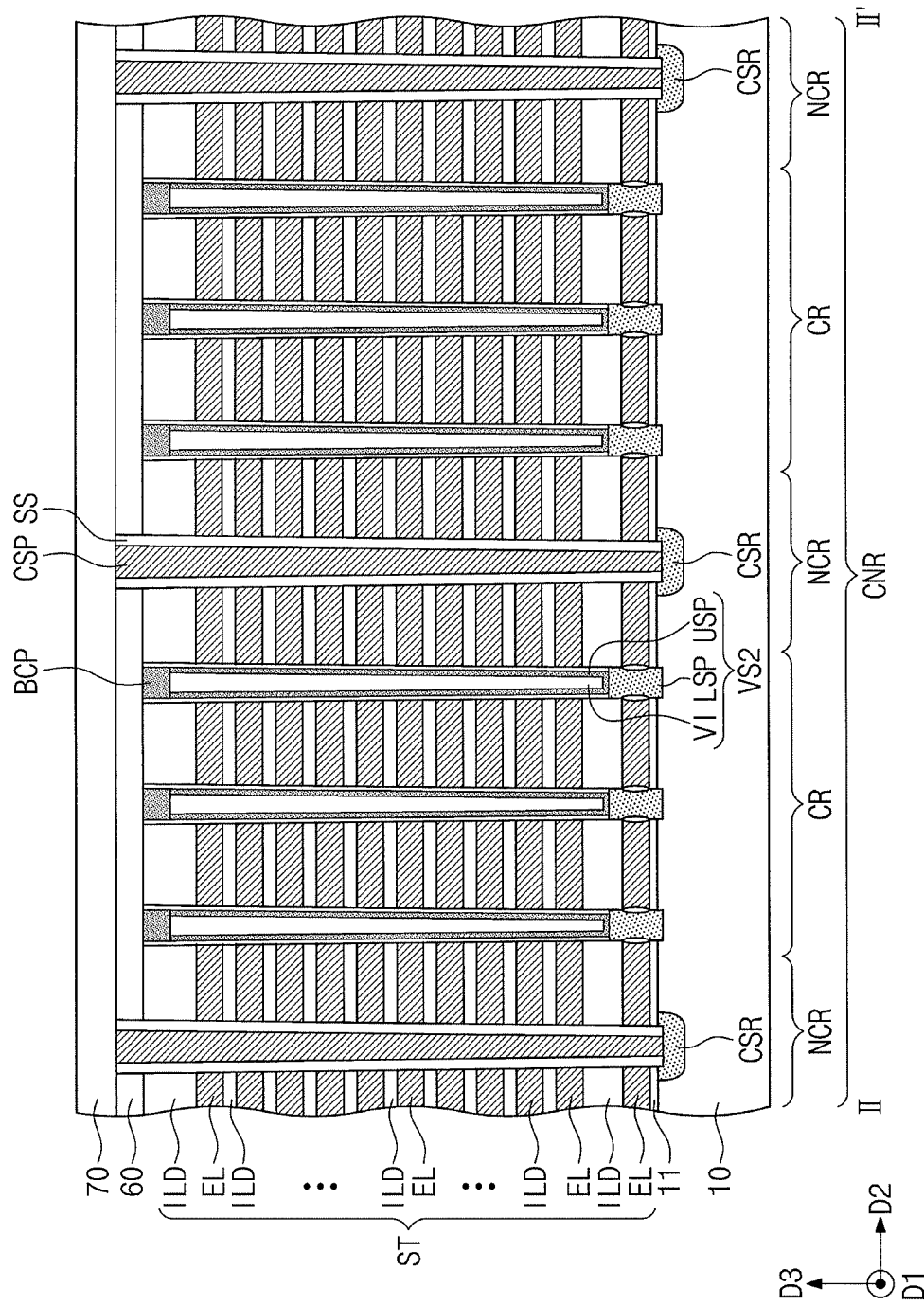
Figure 14D:
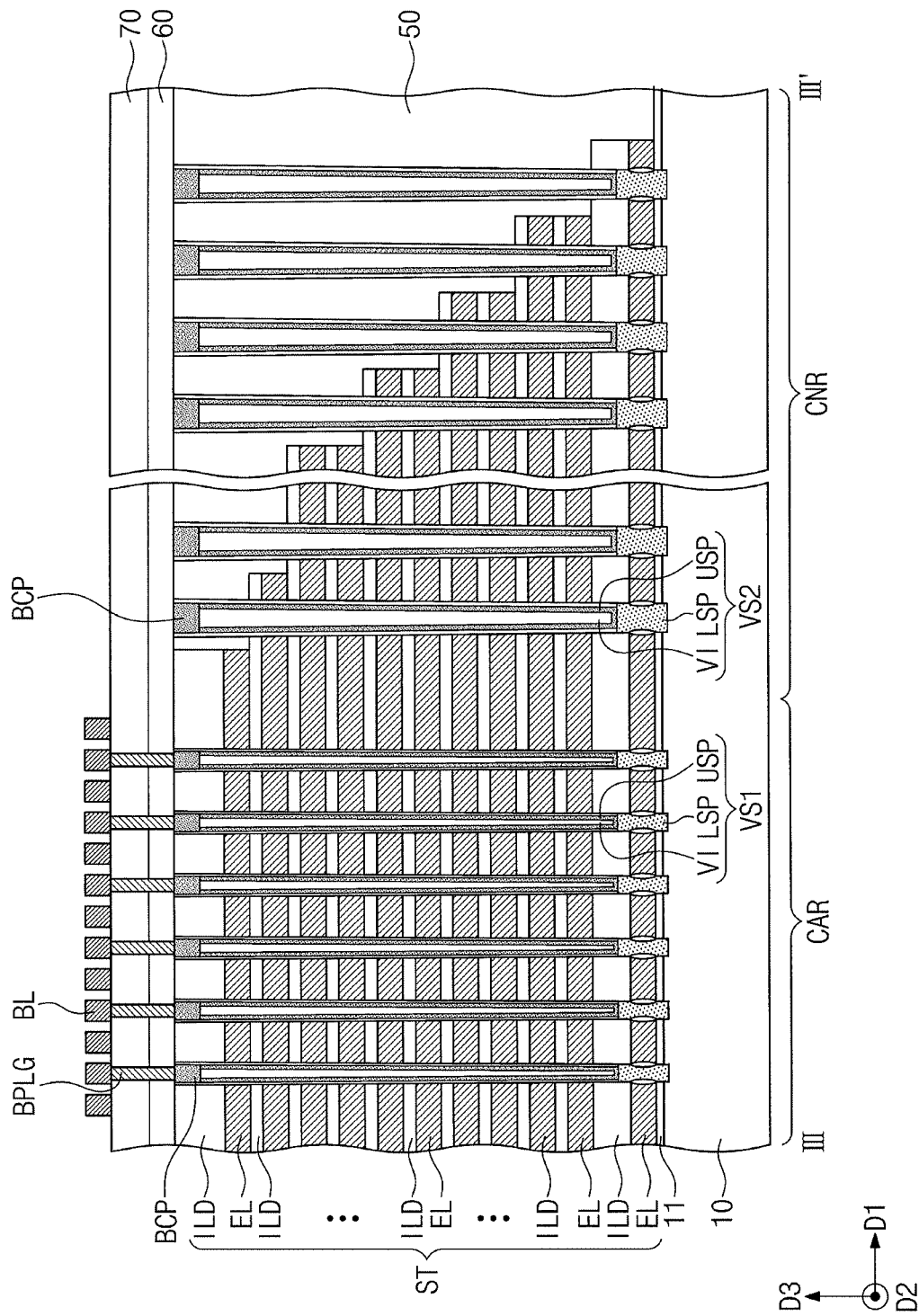
FIG. 14D is a cross-sectional view taken along line of FIG. 13, illustrating a three-dimensional semiconductor memory device according to some embodiments.
Figure 15A:
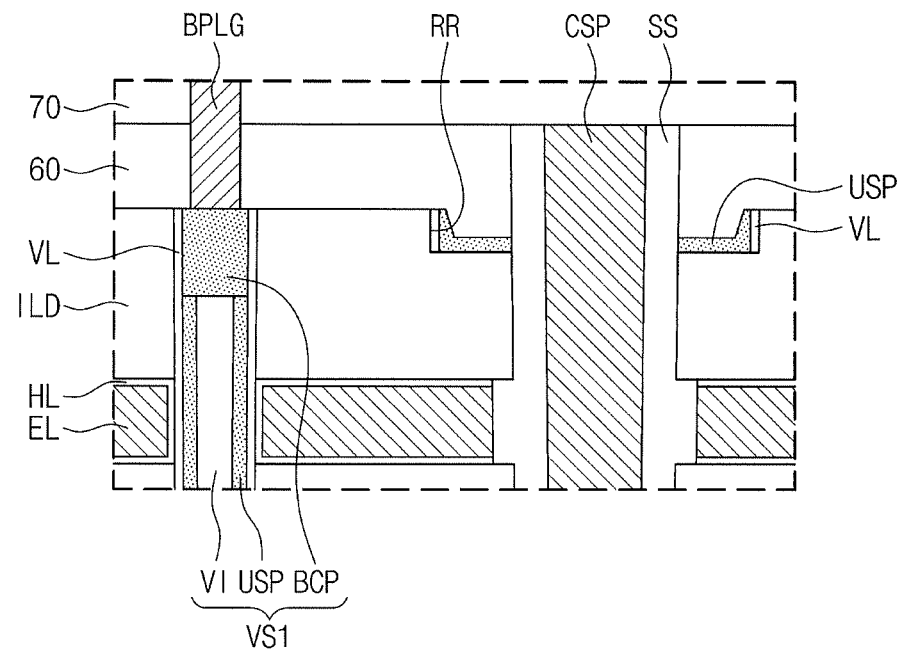
FIG. 15A is an enlarged view of a portion A of FIG. 14A according to some embodiments.
Figure 15B:
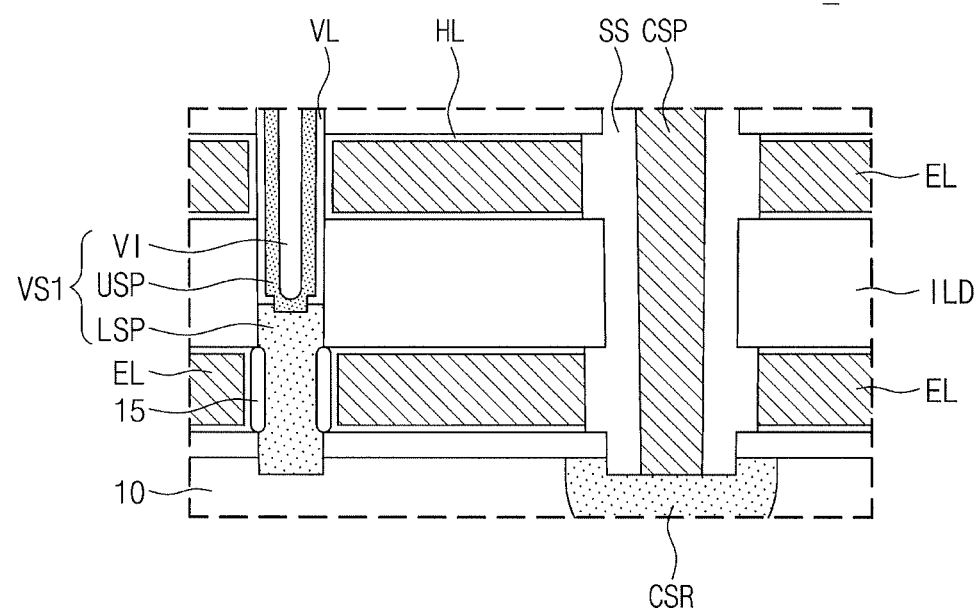
FIG. 15B is an enlarged view of a portion B of FIG. 14A according to some embodiments.

FIG. 13 is a plan view illustrating a three-dimensional semiconductor memory device according to some embodiments. FIG. 14A is a cross-sectional view taken along line I-I' of FIG. 13, illustrating a three-dimensional semiconductor memory device according to some embodiments. FIGS. 14B and 14C are cross-sectional views taken along line II-IF of FIG. 13, illustrating a three-dimensional semiconductor memory device according to some embodiments. FIG. 14D is a cross-sectional view taken along line of FIG. 13, illustrating a three-dimensional semiconductor memory device according to some embodiments. FIG. 15A is an enlarged view of portion A of FIG. 14A according to some embodiments. FIG. 15B is an enlarged view of portion B of FIG. 14A according to some embodiments.

Referring to FIGS. 13, 14A, 14C, and 14D, the substrate 10 may include the cell array region CAR and the connection region CNR arranged in the first direction D1. Each of the cell array region CAR and the connection region CNR may include the channel regions CR and the non-channel regions NCR that are alternately arranged in the second direction D2.

Each of the stack structures ST may extend in the first direction D1 from the cell array region CAR into the connection region CNR and may be provided on the substrate 10 in the channel regions CR. Each of the stack structures ST may include the insulation layers ILD and the electrodes EL alternately stacked on the substrate 10 in the third direction D3.

Each of the stack structures ST may have a stepped structure in the connection region CNR. For example, the electrodes EL may have a length in the first direction D1 decreasing in a direction away from the substrate 10. A height of each of the stack structures ST may be decreased in a direction away from the cell array region CAR. The interfacial insulation layer 11 may be formed between the substrate 10 and a lowermost one of the electrodes EL A planarized insulation layer 50 may be formed on the substrate 10 to cover the stack structures ST. The planarized insulation layer 50 may have a substantially planarized upper surface and may cover the stepped structures of the stack structures ST in the connection region CNR. The planarized insulation layer 50 may include one insulation layer or a plurality of stacked insulation layers. The planarized insulation layer 50 may include, e.g., silicon oxide and/or a low-k dielectric material.

A plurality of first vertical channels VS1 may penetrate the stack structures ST in the cell array region CAR. A plurality of second vertical channels VS2 may penetrate the planarized insulation layer 50 and the stack structures ST in the connection region CNR.

The plurality of first vertical channels VS1 may be arranged in a matrix form or in a staggered zigzag form, in plan view. Each of the first vertical channels VS1 may have a circular upper surface. Each of the second vertical channels VS2 may have a width greater than a width of each of the first vertical channels VS1. Each of the second vertical channels VS2 may have a substantially circular shape in plan view. Alternatively, in some embodiments, each of the second vertical channels VS2 may have an elliptical shape or a bar shape in plan view. Upper surfaces of the second vertical channels VS2 may be coplanar with upper surfaces of the first vertical channels VS1. The second vertical channels VS2 may penetrate end portions of the electrodes EL.

Referring to FIGS. 13, 14A, 14C, 14D, 15A and 15B, each of the first and second vertical channels VS1 and VS2 may include the lower semiconductor pattern LSP, the upper semiconductor pattern USP, and the bit line conductive pad BCP as described above. Each of the first and second vertical channels VS1 and VS2 may further include the buried insulation layer VI. The vertical insulation layer VL may be between each of the stack structures ST and the upper semiconductor pattern USP and may extend in the third direction D3. The horizontal insulation layer HL may be between the vertical insulation layer VL and may extend on upper surfaces and lower surfaces of the electrodes EL and the electrodes EL. Referring to FIG. 15B, a gate insulation layer 15 may be on a sidewall of the lower semiconductor pattern LSP. The gate insulation layer 15 may be between the lowermost electrode EL and the lower semiconductor pattern LSP. The gate insulation layer 15 may include silicon oxide, e.g., thermal oxide. The gate insulation layer 15 may have a rounded sidewall. A portion of the horizontal insulation layer HL may be between the gate insulation layer 15 and the lowermost electrode EL.

Referring to FIGS. 13, 14A, 14B, 14C, and 14D, common source regions CSR may extend parallel to the stack structures ST in the first direction D1 and may be formed by doping impurities of a second conductivity type into the substrate 10 of the non-channel regions NCR. The common source regions CSR may include, e.g., impurities of an n-type, e.g., arsenic (As) or phosphorous (P).

Common source plugs CSP may be respectively between adjacent stack structures ST and may be connected to the common source regions CSR, respectively. As an example, each of the common source plugs CSP may have a substantially uniform upper width and may extend in the first direction D1. In some embodiments, each of the common source plugs CSP may penetrate an insulation spacer SS to be locally connected to each of the common source regions CSR. The insulation spacer SS may be between each of the common source plugs CSP and each of facing sidewalls of the adjacent stack structures ST.

The first interlayer insulation layer 60 may be on the planarized insulation layer 50 and the stack structures ST and may cover the upper surfaces of the first and second vertical channels VS1 and VS2. A second interlayer insulation layer 70 may be on the first interlayer insulation layer 60 and may cover upper surfaces of the common source plugs CSP. Bit lines BL may be on the second interlayer insulation layer 70 and may extend in the second direction D2. The bit lines BL may be electrically connected to the first vertical channels VS1 through bit line contact plugs BPLG.

In some embodiments, the first vertical channels VS1 may include first outer vertical channels VS1a adjacent to the non-channel regions NCR or the common source plugs CSP and first inner vertical channels VS1b remote from the non-channel regions NCR or the common source plugs CSP in comparison with the first outer vertical channels VS1a. The second vertical channels VS2 may include second outer vertical channels VS2a adjacent to the non-channel regions NCR or the common source plugs CSP and second inner vertical channels VS2b remote from the non-channel regions NCR or the common source plugs CSP in comparison with the second outer vertical channels VS2a.

Referring to FIGS. 13, 14A and 14B, the second outer vertical channels VS2a may bend toward each of the common source plugs CSP in a direction approaching the substrate 10, compared to the first outer vertical channels VS1a. Alternatively, as shown in FIG. 14C, the second outer vertical channels VS2a may be substantially perpendicular to the upper surface of the substrate 10, like the second inner vertical channels VS2b.

Referring to FIG. 15A, the uppermost insulation layer ILD of each of the stack structures ST may include the recess region RR in an upper surface thereof. The recess region RR may be adjacent to the common source plug CSP. A bottom surface of the recess region RR in the uppermost insulation layer ILD may be positioned at a high level than a lower surface of the bit line conductive pad BCP.

The recess region RR may be formed by the anisotropic etch process of forming the first and second channel holes CH1 and CH2 in the cell array region CAR, as described above. In some embodiments, the uppermost insulation layer ILD may have a substantially flat surface without forming the recess region RR. A distance between the recess region RR and the first vertical channel VS1 adjacent thereto may be substantially equal to a distance between adjacent first vertical channels VS1.

The recess region RR of the uppermost insulation layer ILD may be filled with a material of the first interlayer insulation layer 60. A portion of the vertical insulation layer VL and a portion of the upper semiconductor pattern USP may remain in a portion of the recess region RR.

While the present inventive concepts have been particularly shown and described with reference to some embodiments thereof, it will be understood by those of ordinary skill in the art that various changes in form and details may be made therein without departing from the spirit and scope of the following claims.

What is claimed is:

1. A three-dimensional (3D) semiconductor memory device comprising:
   a substrate including channel regions and a non-channel region between the channel regions;
   a stack structure comprising a plurality of electrodes and a plurality of insulation layers alternately stacked on the substrate alternately stacked on the substrate;
   a plurality of vertical structures penetrating the stack structure on the channel regions; and
   a common source plug penetrating the stack structure on the non-channel region,
   wherein an upper surface of an uppermost insulation layer of the plurality of insulation layers has a recessed portion in the non-channel region, and
   wherein the recessed portion is adjacent to the common source plug.

2. The 3D semiconductor memory device of claim 1, wherein a bottom surface of the recessed portion is spaced apart from a top surface of an uppermost electrode of the plurality of electrodes.

3. The 3D semiconductor memory device of claim 1, further comprising
   an insulation spacer between a sidewall of the common source plug and the stack structure.

4. The 3D semiconductor memory device of claim 1, further comprising a portion of a vertical insulation pattern and a portion of an upper semiconductor pattern provided in a portion of the recessed portion.

5. The 3D semiconductor memory device of claim 4, wherein the portion of the vertical insulation pattern covers a sidewall of the recessed portion, and
   wherein the portion of the upper semiconductor pattern covers the portion of the vertical insulation pattern and a bottom surface of the recessed portion.

6. The 3D semiconductor memory device of claim 4, wherein each of the plurality of vertical structures comprises a vertical semiconductor pattern and the vertical insulation pattern surrounding a sidewall of the vertical semiconductor pattern.

7. The 3D semiconductor memory device of claim 6, wherein the vertical insulation pattern includes a charge storage layer.

8. A three-dimensional (3D) semiconductor memory device, comprising:
   a substrate including channel regions and a non-channel region between the channel regions;
   a stack structure comprising a plurality of electrodes and a plurality of insulation layers alternately stacked on the substrate alternately stacked on the substrate; and
   a plurality of vertical structures penetrating the stack structure on the channel regions;
   wherein an upper surface of an uppermost insulation layer of the plurality of insulation layers has a recessed portion, in the non-channel region, and
   wherein a depth of the recessed portion is less than a thickness of the uppermost insulation layer in a direction vertical to a top surface of the substrate.

9. The 3D semiconductor memory device of claim 8, wherein the uppermost insulation layer is disposed on a top surface of an uppermost electrode of the plurality of electrodes, and
   wherein a bottom surface of the recessed portion is vertically spaced apart from the top surface of the uppermost electrode.

10. The 3D semiconductor memory device of claim 8, further comprising
    a common source plug penetrating the stack structure on the non-channel region; and
    an insulation spacer between a sidewall of the common source plug and the stack structure,
    wherein the recessed portion is adjacent to the insulation spacer.

11. The 3D semiconductor memory device of claim 10, wherein and the common source plug extends parallel to the stack structure in a first direction.

12. The 3D semiconductor memory device of claim 8, wherein each of the vertical structures comprises a vertical semiconductor pattern and a vertical insulation layer surrounding a sidewall of the vertical semiconductor pattern, and
    wherein a portion of the vertical semiconductor pattern and a portion of the vertical insulation layer are disposed in the recessed portion.

* * * * *